(12) United States Patent
Isogai et al.

(10) Patent No.: US 6,915,565 B2
(45) Date of Patent: Jul. 12, 2005

(54) METHOD OF DETECTING POSITION OF ROTATION AXIS OF SUCTION NOZZLE

(75) Inventors: Takeyoshi Isogai, Hekinan (JP); Kimihiko Yasuda, Anjo (JP); Noriaki Iwaki, Hekinan (JP); Hiroshi Katsumi, Chiryu (JP)

(73) Assignee: Fuji Machine Mfg., Co., Ltd., Chiryu (JP)

( * ) Notice: Subject to any disclaimer, the term of this patent is extended or adjusted under 35 U.S.C. 154(b) by 260 days.

(21) Appl. No.: 10/041,624

(22) Filed: Jan. 10, 2002

(65) Prior Publication Data

US 2002/0108239 A1 Aug. 15, 2002

(30) Foreign Application Priority Data

Jan. 15, 2001 (JP) ........................................ 2001-007086

(51) Int. Cl.⁷ ................................................ H05K 3/30
(52) U.S. Cl. .......................... 29/833; 29/832; 29/834; 29/720; 29/743; 356/237.4; 356/614
(58) Field of Search ........................ 29/593, 720, 721, 29/743, 832–837, DIG. 44; 356/237.1–237.5, 375, 614

(56) References Cited

U.S. PATENT DOCUMENTS 5,541,834 A * 7/1996 Tomigashi et al. ............ 29/739
5,878,484 A * 3/1999 Araya et al. .................. 29/740
6,457,232 B1 * 10/2002 Isogai et al. .................. 29/833

FOREIGN PATENT DOCUMENTS

| JP | 2-57719 B2 | 12/1990 |
| JP | 4-372199 A | 12/1992 |
| JP | 11-40996 A | 2/1999 |

OTHER PUBLICATIONS

U.S. Appl. No. 09/721,953, filed Nov. 27, 2000, Kawada.
U.S. Appl. No. 09/947,363, filed Sep. 7, 2001, Kawada.

* cited by examiner

Primary Examiner—A. Dexter Tugbang
Assistant Examiner—Donghai D. Nguyen
(74) Attorney, Agent, or Firm—Oliff & Berridge, PLC

(57) ABSTRACT

A method of detecting a position of a rotation axis of a suction nozzle of an electric-component mounting apparatus, the suction nozzle holding, by suction, an electric component, and being rotated about the rotation axis thereof to rotate the electric component held thereby, so that the electric component rotated is mounted on a component-mounting surface of a circuit substrate, the method including the step of detecting, on a position-detecting plane including the component-mounting surface of the circuit substrate, the position of the rotation axis of the suction nozzle.

13 Claims, 16 Drawing Sheets

METHOD OF DETECTING POSITION OF ROTATION AXIS OF SUCTION NOZZLE

BACKGROUND OF THE INVENTION

1. Field of the Invention

The present invention relates to an electric-component mounting system arranged to mount electric components (including electronic components) on a circuit substrate such as a printed-wiring board, and to a method of obtaining relative positions of specific sections of the electric-component mounting system that influence the accuracy of mounting of the electric components.

2. Discussion of Related Art

Electric-component mounting systems often use a suction nozzle arranged to hold an electric component by suction under a negative pressure. Usually, the actual position of the electric component held by the suction nozzle deviates from the nominal position. In view of this positional deviation of the electric component, it has been practiced to detect an error of positioning of the electric component with respect to the suction nozzle by operating an image-taking device to take an image of the electric component as held by the suction nozzle, and compensate the position of the electric component for the detected positioning error before the electric component is mounted on the circuit substrate. The positioning error includes at least one of an error of positioning of the center position or other reference position of the electric component in a plane perpendicular to an axis of rotation of the suction nozzle, and an error of angular positioning of the electric component about the axis of rotation of the suction nozzle. The circuit substrate on which the electric components are mounted is usually positioned by a substrate supporting device. However, the actual positions of pads in a circuit pattern formed on the circuit substrate, on which the electric components are to be mounted, more or less deviate from the nominal positions. In view of this deviation, it is practiced to form fiducial marks on the circuit substrate upon formation of the circuit pattern, detect the positioning error of the circuit substrate by operating an image-taking device to take images of the fiducial marks, estimate the positional deviation of the pads on the basis of the detected positioning error, and compensate the position of each electric component for the estimated positional deviation before the electric component is mounted on the corresponding pad.

To obtain the positioning error of the electric component with respect to the suction nozzle and the positioning error of the fiducial marks on the circuit substrate with respect to the substrate supporting device, it is necessary to know the positions of the electric component and the fiducial marks relative to the suction nozzle and the image-taking devices when the images of the electric component and the fiducial marks are taken by the image-taking devices. The positioning errors of the electric component and the fiducial marks may be obtained by detecting those relative positions using exclusively designed detecting devices, when the electric-component mounting system is assembled or inspected for maintenance purposes. In this case, the obtained positioning errors are used on an assumption that the detected relative positions are maintained in operation of the system. To obtain the positioning errors in this manner, the detecting devices are required to be complicated and tend to be expensive. Further, ballscrews used in relative-movement devices provided to move the suction nozzle, substrate supporting device and image-taking devices relative to each other undergo elongation and contraction due to a change in the temperature, and elastic deformation due to loads acting thereon. In addition, the machine frame of the electric-component mounting system, brackets which hold the image-taking devices, and other portions of the system are also subject to deformation due to a temperature variation. Accordingly, the actual relative positions of the suction nozzle, substrate supporting device and image-taking devices may vary with respect to the detected relative positions, due to the elongation and contraction and elastic deformation of the ballscrews of the relative-movement devices, and deformation of the machine frame and brackets. The above-indicated elongation and contraction and deformation due to the temperature variation will be collectively referred to as "thermal deformation".

It is further noted that the relative positions of the suction nozzle, substrate supporting device and image-taking devices may vary due to chronological changes of the individual elements of the electric-component mounting system, wearing of the elements during use, and displacements of the elements due to loosening of fastening or fixing devices used in the system. To reduce this variation of the relative positions in an electric-component mounting system which is required to assure a high degree of component mounting accuracy, it has been practiced to provide the system with linear encoders to detect the actual relative positions of the suction nozzle, substrate supporting device and image-taking devices, and/or form the brackets for supporting the image-taking devices, of highly rigid materials having a relatively low coefficient of thermal expansion, and/or design the lenses of the image-taking devices such that the lenses are highly resistant to vibrations. However, such measures inevitably result in an increase in the cost of manufacture of the electric-component mounting system, and cannot therefore be said to be completely satisfactory.

SUMMARY OF THE INVENTION

The present invention was made in view of the problems encountered in the prior art described above. It is therefore an object of the present invention to make it possible to improve the component mounting accuracy of the electric-component mounting system, while minimizing an increase of the cost of manufacture of the system, or to obtain the relative positions of those sections of the system that influence the component mounting accuracy.

The above object may be achieved according to any one of the following features of the present invention in the form of a method of detecting a position of a rotation axis of a suction nozzle, an electric-component mounting system, a program for use in an electric-component mounting system, and a medium for recording a program for use in an electric-component mounting system. Each of the following features of the invention is numbered like the appended claims and depends from the other feature or features, where appropriate, to indicate and clarify possible combinations of technical features. It is to be understood that the present invention is not limited to the technical features or any combinations thereof that will be described for illustrative purposes only. It is to be further understood that a plurality of elements included in any one of the following features of the invention are not necessarily provided all together, and that the invention may be embodied without some of the elements described with respect to the same feature.

(1) A method of detecting a position of a rotation axis of a suction nozzle of an electric-component mounting apparatus, the suction nozzle holding, by suction, an electric component, and being rotated about the rotation axis thereof to rotate the electric component held thereby, so that the electric component rotated is mounted on a component-mounting surface of a circuit substrate, the method comprising the step of:

detecting, on a position-detecting plane including the component-mounting surface of the circuit substrate, the position of the rotation axis of the suction nozzle.

It has been a conventional practice to detect a position of a rotation axis of a suction nozzle in a state in which the suction nozzle is positioned at a first position higher than a second position where the nozzle mounts an electric component on a circuit substrate. Therefore, while the suction nozzle is lowered from the first position to the second position, the position of the rotation axis of the suction nozzle more or less changes, which is considered as one of various causes to lower the component mounting accuracy. In contrast, the present invention is freed of this problem.

(2) A method according to the first feature (1), wherein the step of detecting the position comprises lowering the suction nozzle taking a substantially vertical posture, to position the suction nozzle at an image-taking position where a lower end surface of the suction nozzle is substantially level with the component-mounting surface of the circuit substrate, taking, with an image-taking device, a first image of the lower end surface of the suction nozzle positioned at the image-taking position, rotating, at least one time, the suction nozzle about the rotation axis thereof by a predetermined angle, taking, with the image-taking device, a second image of the lower end surface of the suction nozzle rotated by the predetermined angle, and processing the first image and the second image, to determine the position of the rotation axis of the suction nozzle.

At the image-taking position, the lower end surface of the suction nozzle may be literally level with the component-mounting surface of the circuit substrate, or may be more or less vertically distant from the component-mounting surface, e.g., by a distance equal to a thickness of the electric component. Since the suction nozzle is lowered to the second position where the lower end surface of the nozzle is level with the component-mounting surface of the circuit substrate, and an image of the lower end surface is taken by the image-taking device, the position of the rotation axis of the nozzle can be detected on the plane including the component-mounting surface. According to this feature, it is preferred to utilize, as the image-taking device, one employed for taking an image of the electric component held by the suction nozzle. In the latter case, it is preferred that the image-taking device should also take the image of the electric component in the state in which the nozzle is positioned at the second position.

(3) A method according to the first feature (1), wherein the step of detecting the position comprises steps of:

preparing a calibration member having, substantially on the position-detecting plane, a support surface and at least one first positioning reference, placing, on the support surface, a calibration gauge having at least one second positioning reference, taking, with an image-taking device, a first image of the first positioning reference and the second positioning reference, holding, with the suction nozzle, the calibration gauge to move the gauge off the support surface, rotating the suction nozzle holding the calibration gauge, about the rotation axis of the nozzle, to rotate the gauge by a predetermined angle, placing, with the suction nozzle, the calibration gauge rotated by the predetermined angle, on the support surface, taking, with the image-taking device, a second image of the first positioning reference and the second positioning reference, and processing the first image and the second image, to determine a relative position between a reference point of the calibration member and the position of the rotation axis of the suction nozzle.

The calibration member may have the support surface literally level with the position-detecting plane, and has at least one first positioning reference on at least one reference surface more or less vertically distant from the position-detecting plane, e.g., by a distance equal to a thickness of the calibration gauge. The step of detecting the position may comprise repeating, at least one more time, the step of holding the calibration gauge, the step of rotating the suction nozzle, the step of placing the calibration gauge, and the step of taking the second image, and the step of processing the first and second images may comprise processing the first image and at least two second image to determine the relative position between the reference point of the calibration member and the position of the rotation axis of the suction nozzle. According to this feature, the position of the rotation axis of the suction nozzle can be detected on the plane including the component-mounting surface of the circuit substrate. In addition, an error of a relative position between the rotation axis of the nozzle and the image-taking device can be detected while the first positioning reference of the calibration member is used as a parameter. According to this feature, it is preferred to use, as the image-taking device, a fiducial-mark-image taking device employed for taking an image of at least one fiducial mark provided on the circuit substrate. In the latter case, an error of a relative position between the rotation axis of the suction nozzle and the fiducial-mark-image taking device can be detected easily and accurately.

(4) A method of detecting a position of a rotation axis of a suction nozzle of an electric-component mounting apparatus, the suction nozzle holding, by suction, an electric component, the mounting apparatus including a fiducial-mark-image taking device that takes an image of at least one fiducial mark provided on a circuit substrate, determining, based on the taken image, a position of the circuit substrate, moving, according to the determined position, the suction nozzle holding the electric component, toward the circuit substrate, and rotating the suction nozzle about the rotation axis thereof to rotate the electric component to a predetermined angular position, so that the electric component taking the predetermined angular position is mounted at a predetermined position on a component-mounting surface of the circuit substrate, the method comprising the step of:

preparing a calibration member having a support surface parallel to the component-mounting surface, and having at least one first positioning reference, placing, on the support surface, a calibration gauge having at least one second positioning reference, taking, with the fiducial-mark-image taking device, a first image of the first positioning reference and the second positioning reference, holding, with the suction nozzle, the calibration gauge to move the gauge off the support surface, rotating the suction nozzle holding the calibration gauge, about the rotation axis of the nozzle, to rotate the gauge by a predetermined angle, placing, with the suction nozzle, the calibration gauge rotated by the predetermined angle, on the support surface, taking, with the fiducial-mark-image taking device, a second image of the first positioning reference and the second positioning reference and processing the first image and the second image, to determine a relative position between a reference point of the calibration member and the position of the rotation axis of the suction nozzle.

The present method may further comprises repeating, at least one more time, the step of holding the calibration gauge, the step of rotating the suction nozzle, the step of placing the calibration gauge, and the step of taking the second image, and the step of processing the first and second images may comprise processing the first image and at least two second images to determine the relative position between the reference point of the calibration member and the position of the rotation axis of the suction nozzle. According to this invention, an error of a relative position between the fiducial-mark-image taking device and the rotation axis of the suction nozzle can be detected easily and accurately. It is noted that according to this invention, it is not essentially required that the support surface of the calibration member should be provided on the plane including the component-mounting surface of the circuit substrate.

(5) A method according to the third or fourth feature (3) or (4), wherein at least one of the calibration member and the calibration gauge has a plurality of reference marks which are provided in a surface thereof and which provide a corresponding one of the at least one first positioning reference and the at least one second positioning reference.

For example, respective edge lines of the calibration member and the calibration gauge may be utilized as respective positioning references and respective images of those edge lines may be taken. However, according to the fifth feature (5), respective positions of the calibration member and the calibration gauge can be more easily and accurately detected based on the reference marks provided on the surface.

(6) A method according to the fifth feature (5), wherein the calibration gauge has a plurality of reference holes which are formed through a thickness thereof and which provide the plurality of reference marks.

Since the reference holes formed through the thickness of the calibration gauge are used as the reference marks, respective positions of the reference marks can be detected based on either a silhouette image thereof or a normal image thereof. In the case where the normal image of the reference marks is taken, it is preferred that a surface of the calibration gauge should have a light color such as white.

(7) A method according to the fifth or sixth feature (5) or (6), the calibration gauge has at least two groups of reference marks including a first group of reference marks that are distant from each other by a first distance, and a second group of reference marks which are distant from each other by a second distance different from the first distance.

Since the calibration gauge has at least two groups of reference marks, the position of the calibration gauge can be detected by selecting, from the two groups of reference marks, one group of reference marks that corresponds to a field of view, or a magnifying factor, of the image-taking device.

(8) A method according to any of the fifth to seventh features (5) to (7), wherein the calibration member has an upper surface level with an upper surface of the calibration gauge, and has the plurality of reference marks on the upper surface thereof.

Since the calibration member has the reference marks on the upper surface thereof level with an upper surface of the calibration gauge, a sharp or clear image of the respective reference marks of the calibration member and the calibration gauge can be taken at one time and accordingly the accuracy of detection of positions can be easily improved.

(9) A method according to any of the first to eighth features (1) to (8), further comprising a step of applying a negative pressure to the calibration gauge placed on the calibration member.

Since the calibration gauge is held, by suction, by the support surface of the calibration member, the gauge is effectively prevented from moving out of position relative to the calibration member. Accordingly, for example, an error of a relative position between the rotation axis of the suction nozzle and the calibration member, and an error of a relative position between the rotation axis of the suction nozzle and the fiducial-mark-image taking device can be accurately detected.

(10) A method according to any of the first to ninth features (1) to (9), further comprising steps of:

taking, with a fiducial-mark-image taking device which takes an image of at least one fiducial-mark provided on the component-mounting surface of the circuit substrate, an image of the first positioning reference of the calibration member, and determining, based on the taken image of the first positioning reference, an error of a relative position between the fiducial-mark-image taking device and the calibration member.

According to this feature, an error of a relative position between the calibration member and the fiducial-mark-image taking device can be accurately detected.

(11) An electric-component mounting system comprising:

a supporting device which supports a circuit substrate;

a supplying device which supplies at least one electric component;

a mounting device which includes a suction nozzle that receives, and holds, the electric component supplied from the supplying device, and which rotates the suction nozzle holding the electric component, to rotate the electric component, so that the electric component rotated is mounted on the circuit substrate supported by the supporting device;

a calibration member which has a support surface, and at least one first reference mark provided in vicinity of the support surface;

a calibration gauge which has at least one second reference mark and which is placed on the support surface; and an image-taking device which takes an image of at least one third reference mark provided on the circuit substrate supported by the supporting device and which takes an image of the first reference mark and second reference mark in a state in which the calibration gauge is placed on the calibration member.

The present electric-component mounting system can advantageously carry out a method according to the first, third, or fourth feature (1), (3), or (4).

(12) A system according to the eleventh feature (11), wherein the calibration member is provided at a position where the support surface thereof on which the calibration gauge is placed is positioned substantially on a plane including the component-mounting surface of the circuit substrate.

(13) A system according to the eleventh or twelfth feature (11) or (12), wherein at least one of (a) the calibration member and (b) the calibration gauge has a corresponding one of (a) a plurality of the first reference marks that are distant from each other and (b) a plurality of the second reference marks that are distant from each other.

(14) A system according to any of the eleventh to thirteenth features (11) to (13), wherein the calibration gauge has a plurality of reference holes which are formed through a thickness thereof and which provide a plurality of the second reference marks.

(15) A system according to any of the eleventh to fourteenth features (11) to (14), wherein the calibration gauge has at least two groups of the second reference marks including a first group of the second reference marks that are distant from each other by a first distance, and a second group of the second reference marks which are distant from each other by a second distance different from the first distance.

(16) A system according to any of the eleventh to fifteenth features (11) to (15), wherein the calibration member has an upper surface level with an upper surface of the calibration gauge, and has a plurality of the first reference marks on the upper surface thereof.

(17) A system according to any of the eleventh to sixteenth features (11) to (16), the calibration member has, in the support surface, at least one suction hole through which air is sucked.

(18) A control program for carrying out a method according to any of the first to tenth features (1) to (10).

(19) A recording medium for recording a control program for carrying out a method according to any of the first to tenth features (1) to (10), such that the control program is readable by a computer.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE PREFERRED EMBODIMENTS

Figure 1:
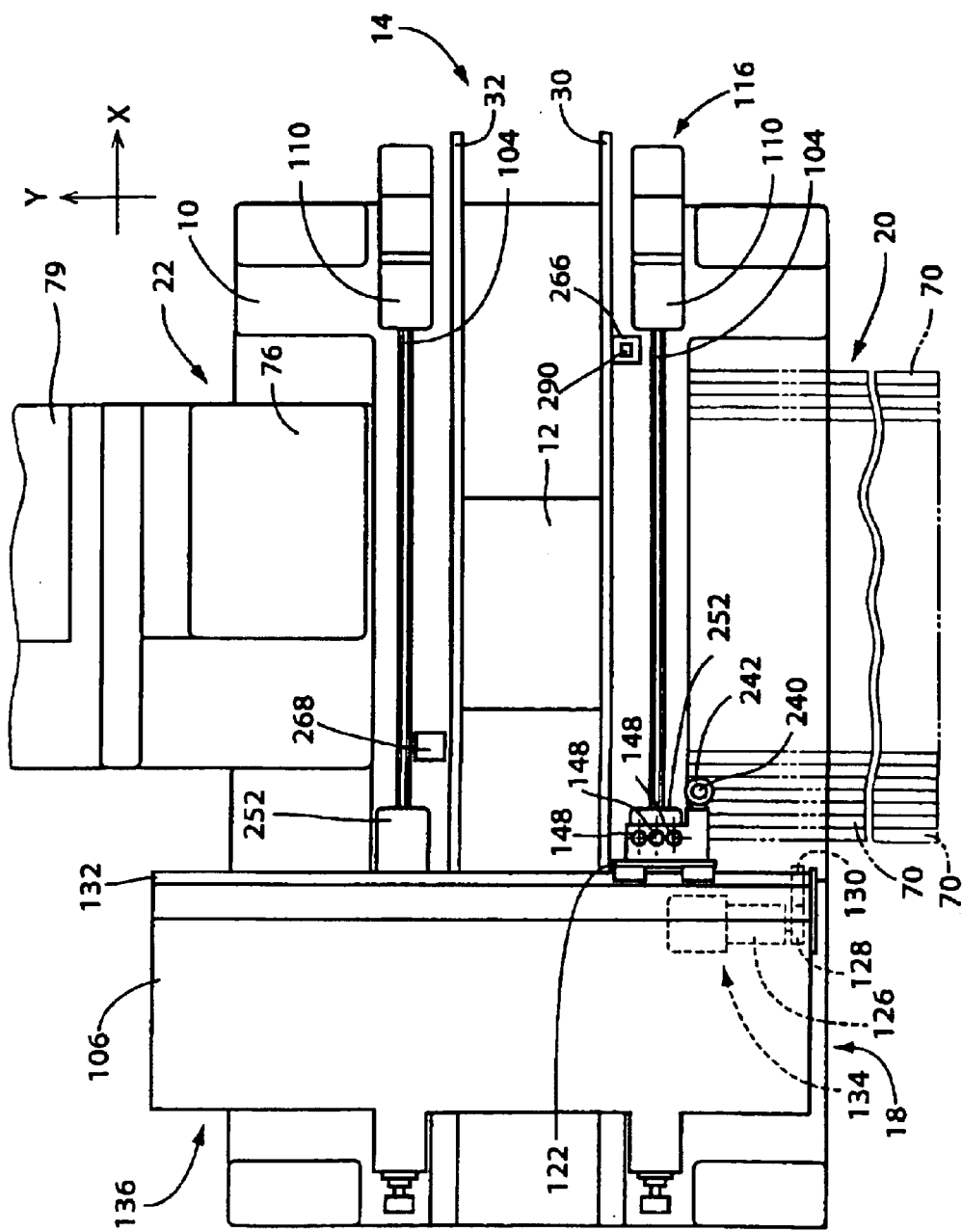
FIG. 1 is a plan view showing an electronic-component mounting system constructed according to one embodiment of this invention.
Figure 2:
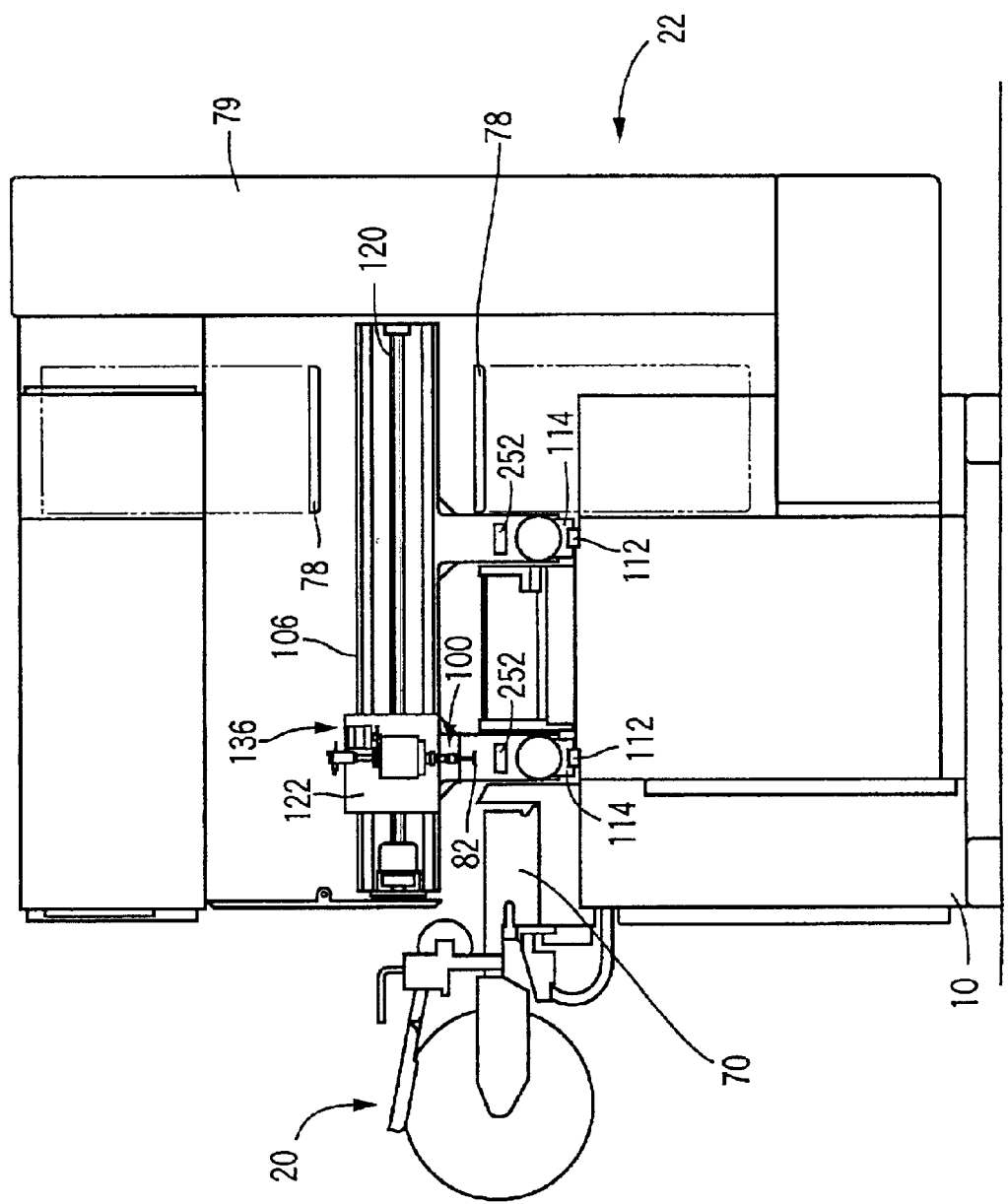
FIG. 2 is a side elevational view of the electronic-component mounting system of FIG. 1.

Referring first to FIGS. 1 and 2, reference numeral 10 denotes a machine base of an electronic-component mounting system. The electronic-component mounting system includes a printed-wiring board conveyor (PWB conveyor) 14, a component mounting device 18 and component supply devices 20, 22, which are mounted on the machine base 10. The PWB conveyor 14 is arranged to transfer a circuit substrate in the form of a printed-wiring board 12 in an X-axis direction (in the left and right directions as seen in FIG. 1). The component mounting device 18 is arranged to mount electric components in the form of electronic components on the printed-wiring board 12. The component supply devices 20, 22 are arranged to supply the component mounting device 18 with the electronic components.

In the present embodiment, the printed-wiring board 12 is transferred by the PWB conveyor 14 such that the printed-wiring board 12 maintains a horizontal attitude or posture. The printed-wiring board 12 is stopped by a suitable stopper device (not shown), to be located at a predetermined component-mounting position. The board 12 located at the component-mounting position is supported by a circuit-board support device in the form of a printed-wiring board support device 26 which will be described by reference to FIG. 5. In the present electronic-component mounting system, the printed-wiring board 12 is supported such that a component-mounting surface 28 of the board 12 on which the electronic components are mounted is parallel to the horizontal plane. The above-indicated X-axis direction in which the board 12 is transferred by the PWB conveyor 14 is parallel to an X axis of an XY coordinate system in an XY plane parallel to the horizontal component-mounting surface 28.

Figure 5:
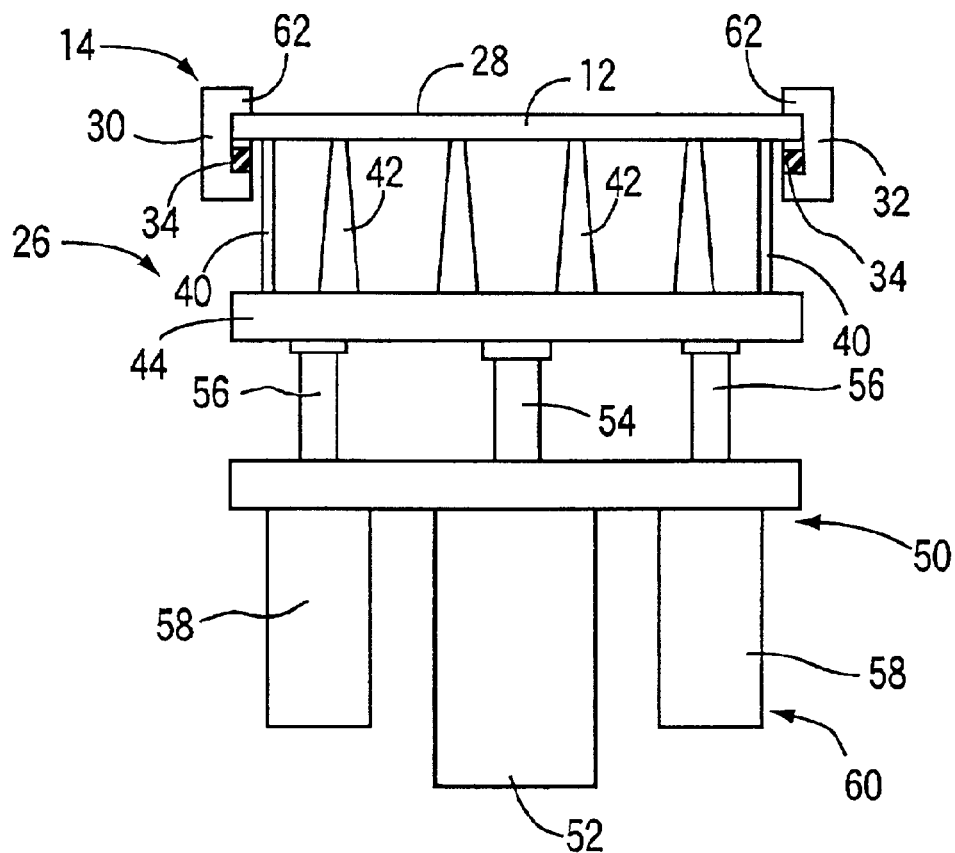
FIG. 5 is a side elevational view schematically showing a printed-wiring board support device of the electronic-component mounting system.

The printed-wiring board conveyor or PWB conveyor 14 is provided with a pair of guide rails 30, 32, as schematically shown in FIGS. 1 and 5. One of the guide rails 30, 32 is a stationary guide rail fixed on the machine base 10, while the other guide rail is a movable guide rail which is movable toward and away from the stationary guide rail, to change a distance between the stationary and movable guide rails, depending upon the width of the PWB conveyor 14, which is a dimension as measured in a Y-axis direction perpendicular to the X-axis direction in which the PWB conveyor 14 is transferred.

Each of the two guide rails 30, 32 is constructed to guide an endless conveyor belt 34 such that the belt 34 can travel in a loop. The printed-wiring board 12 is placed on the conveyor belts 34, and is transferred by the conveyor belts 34 when the conveyor belts 34 are rotated in synchronization with each other by drive source in the form of a printed-wiring board feed motor (PWB feed motor) 36 indicated in the block diagram of FIG. 13. As schematically shown FIG. 5, the printed-wiring board support device 26 includes a pair of clamping members 40 and a plurality of supporting members 42. Each of the clamping members 40 takes the form of a plate fixed upright at a corresponding one of opposite ends of an elevator platform 44 such that the two clamping members 40 extend in the X-axis direction, namely, in the direction of movement of the board 12. The plurality of supporting members 42 are fixed upright in a widthwise intermediate portion of the elevator platform 44 which is located intermediate between the two clamping members 40. The elevator platform 44 is located under the printed-wiring board 12 at the predetermined component-mounting position, such that the elevator platform 44 is opposed to the lower surface of the board 12 which is opposite to the component-mounting surface 28 on which the electronic components are mounted by the present electronic-component mounting system. The elevator platform 44 is lifted and lowered by an elevator drive device 50, which includes a drive source in the form of a fluid-operated actuator such as a fluid-operated cylinder. In the specific example of FIG. 5, the elevator drive device 50 used, as the drive source, an elevator cylinder 52 which is a pneumatic cylinder. The elevator cylinder 52 is disposed so as to extend in the vertical direction, and includes a piston rod 54 for engagement with the elevator platform 44.

The printed-wiring board support device 26 further includes a guiding device 60, which includes two or more sets of guide rods 56 and guide sleeves 58. The guide rod 56 of each set is fixed to the elevator platform 44 and is guided by the corresponding guide sleeve 58. When the piston rod 54 of the elevator cylinder 52 is moved up and down, the elevator platform 44 is lifted and lowered by the piston rod 54 while the elevator platform 44 is guided by the guiding device 60, so that the clamping members 40 and the supporting members 42 are moved perpendicularly to the component-mounting surface 28 of the printed-wiring board 12, in opposite directions toward and away from the board 12. When the elevator platform 44 is placed at its elevated operating position, the clamping members 40 hold the board 12 apart from the upper surfaces of the conveyor belts 34 such that the board 12 is clamped at its opposite ends corresponding to the conveyor belts 34, in pressing contact with the upper ends of the clamping members 40 and hold-down portions 62 provided in the guide rails 30 32, and such that the supporting members 42 support the board 12, with their upper ends held in contact with the lower surface of the board 12.

The component supply devices 20, 22 are spaced from each other in the Y-axis direction perpendicular to the X-axis direction, and located on the opposite sides of the PWB conveyor 14, as shown in FIGS. 1 and 2. In the present embodiment, the component supply device 20 is of tape feeder type, while the component supply device 22 is of tray type. The component supply device 20 of tape feeder type includes a multiplicity of tape feeders 70 which are arranged in the X-axis direction. Each tape feeder 70 has a tape cartridge arranged to feed a carrier tape which accommodates electronic components. The carrier tape includes a carrier substrate which has a multiplicity of component-accommodating recesses formed at a suitable interval along the length of the carrier tape. The electronic components are accommodated in the respective component-accommodating recesses. The opening of each component-accommodating recess is closed by a covering film bonded to the carrier substrate, to prevent the electronic components from moving out of the recesses when the carrier tape is fed. In operation of each tape feeder 70, the carrier tape is fed from the tape cartridge, with a predetermined pitch in the Y-axis direction, while the covering film is separated from a lengthwise portion of the carrier substrate which has been fed from the tape cartridge. Thus, the electronic components are fed one after another to a predetermined component-supply position. The electronic components accommodated in the tape feeders 70 include electronic components having leads, and electronic components not having leads. Since the electronic components of either kind are substantially accurately positioned within the respective component-accommodating recesses, each electronic component fed to the predetermined component-supply position can be held at an almost central portion thereof by the component mounting device 18, and can be taken out of the recess, while the electronic component almost maintains predetermined attitude and position relative to the component mounting device 18.

Figure 3:
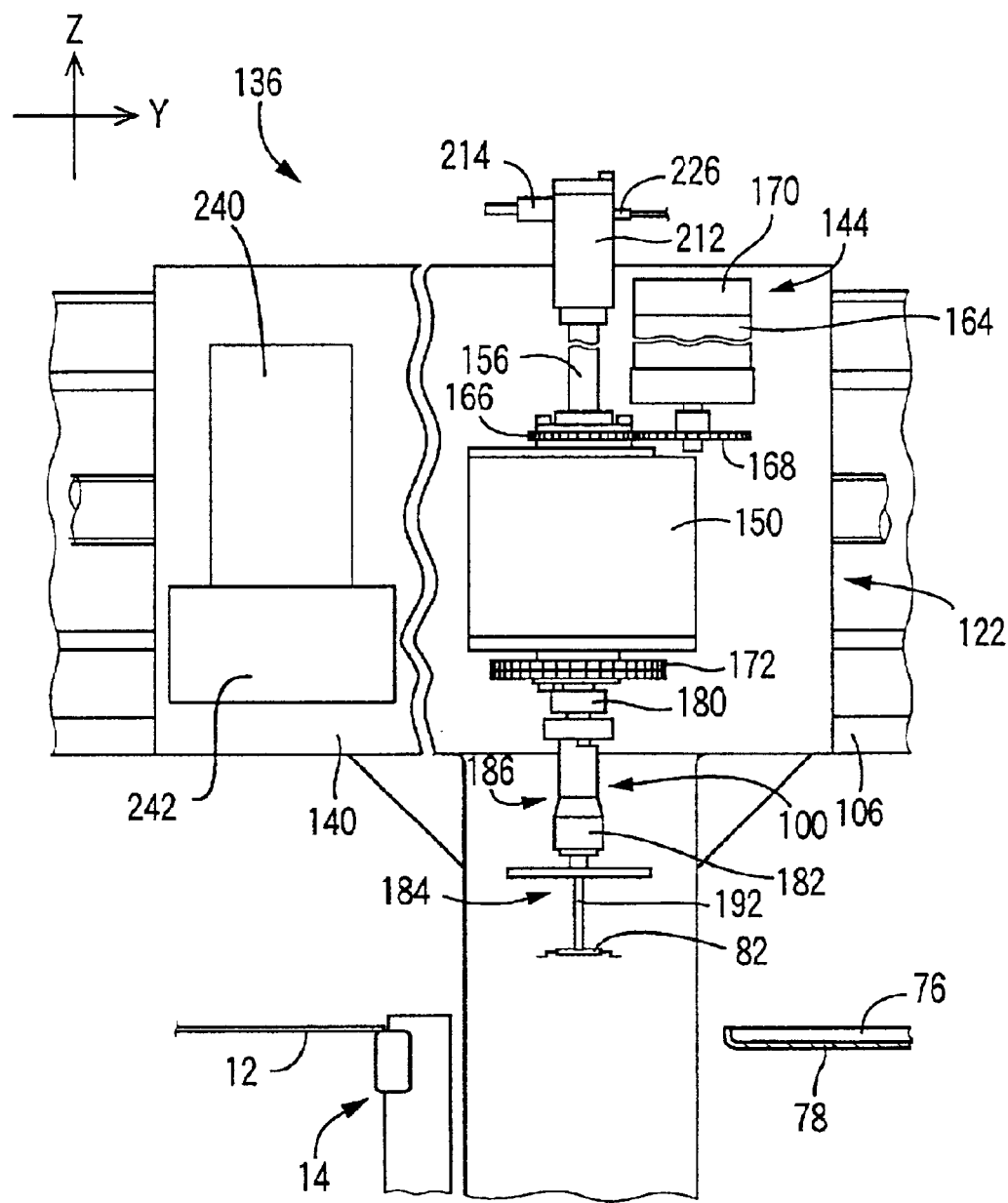
FIG. 3 is a front elevational view showing a component mounting device in the electronic-component mounting system.

The component supply device 22 of tray type includes a multiplicity of component trays 76 (FIGS. 1 and 3) accommodating electronic components. The component trays 76 are accommodated in respective multiple tray boxes 78, which are vertically arranged and are supported by respective support members. The tray boxes 78 are elevated one after another by an elevator device disposed within a column 79 (FIG. 1), to a predetermined component-supply position. For a component holding device 100 (which will be described) of the component mounting device 18 to receive the electronic components from the component tray 76 in the tray box 78 located at the component-supply position, some vertical space must be provided above the component-supply position. To provide this vertical space, the tray box 78 from which the electronic components have been transferred to the component holding device 100 is moved further upwards from the component-supply position to a predetermined retracted position when the next tray box 78 is moved to the component-supply position, so that the required vertical space is provided between the component-supply position and the retracted position. The component supply device 22 of tray type is identical in construction to a component supply device disclosed in Japanese patent document No. 2-57719.

Figure 6:
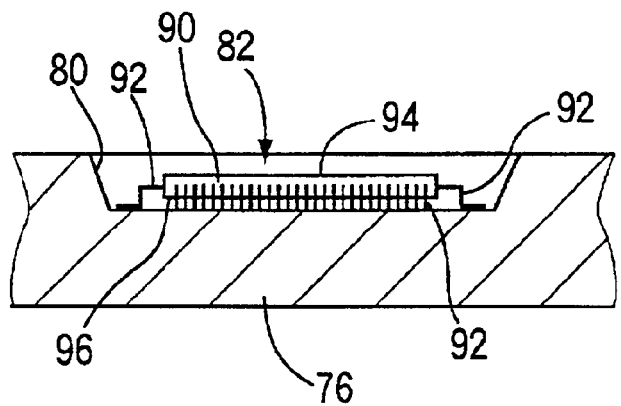
FIG. 6 is a side elevational view showing an electronic component accommodated in a component tray in the electronic-component mounting system.

Thus, the component mounting device 18 receives the electronic components one after another from the component 76 in the tray box 78 at the component-supply position above which the required vertical space is provided. Each component tray 76 accommodates the electronic components 82 in component accommodating recesses 80 (FIG. 6) which are arranged in a matrix. Each electronic component 82 accommodated in the corresponding recess 80 is substantially positioned, so that the electronic component 82 can be held at an almost central portion thereof by the component mounting device 18, and can be taken out of the recess 80, while the electronic component almost maintains predetermined attitude and position relative to the component mounting device 18. In the specific example of FIG. 6, the electronic component 82 has a multiplicity of leads 92 extending from the four side faces of a rectangular body 90. The electronic component 82 is mounted at its bottom surface 96 on the printed-wiring board 12 so that the leads 92 are connected to the printed wiring of the board 12. The electronic component 82 has a top surface 94 opposite to the bottom surface 96. The electronic component 82 may be provided with a ball-grid array, or may not have the leads 92.

Figure 4:
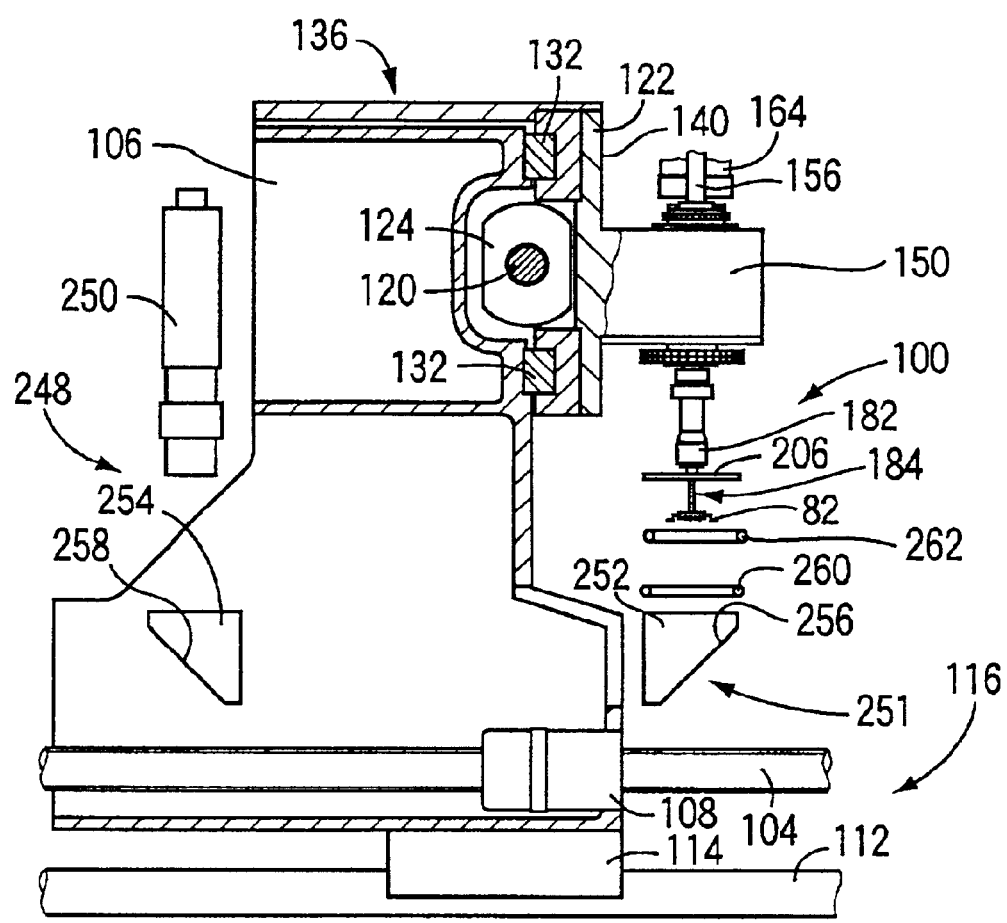
FIG. 4 is a side elevational view, partly in cross section, of the component mounting device of FIG. 3.

The component holding device 100 of the component mounting device 18 is movable in the mutually perpendicular X-axis and Y-axis directions, so that the component holding device 100 can take a linear movement having X-axis and Y-axis components, to move each electronic component 82 to a desired position on or above the component-mounting surface 28 of the printed-wiring board 12. To move the component holding device 100 in the X-axis direction, the component mounting device 18 includes two ballscrews 104 disposed on the machine base 10, on the opposite sides of the PWB conveyor 14, so as to extend in the X-axis direction, as shown in FIG. 1, and an X-axis slide 106 having two ballnuts 108 (only one of which is shown in FIG. 4) which engage the respective ballscrews 104. The device 18 further includes two X-axis drive motors 110 for rotating the ballscrews 104, for moving the X-axis slide 106 in the X-axis direction. As shown in FIG. 1, the X-axis slide 106 extends in the Y-axis direction across the PWB conveyor 14, and has a length corresponding to the distance between the component supply device 20 of feeder type and the component supply device 22 of tray type. On the machine base 10, there are disposed two guide rails 112 located under the respective ballscrews 104. The X-axis slide 106 has two guide blocks 114 which slideably engage the guide rails 112, for guiding the X-axis slide 106 in the X-axis direction. It will be understood that the ballscrews 104, ballnuts 108 and X-axis drive motors 110 cooperate with each other to constitute an X-axis drive device 116.

On the X-axis slide 106, there is disposed a ballscrew 120 so as to extend in the Y-axis direction, as shown in FIG. 4. The X-axis slide 106 carries a Y-axis slide 122 having a ballnut 124 which engages the ballscrew 120. The ballscrew 120 is rotated by a Y-axis drive motor 126 (FIG. 1) through gears 128, 130, so that the Y-axis slide 122 is moved in the Y-axis direction while being guided by a pair of guide rails 132 (FIG. 4). It will be understood that the ballscrew 120, ballnut 124 and Y-axis drive motor 126 constitute a Y-axis drive device 134, and that the Y-axis drive device 134 cooperates with the X-axis slide 106, X-axis drive device 116 and Y-axis slide 122, to constitute an XY positioning device 136 for moving the component holding device 100 to a desired position in the XY plane.

The Y-axis slide 122 has an upright side surface 140 on which there are mounted the above-indicated component holding device 100, a Z-axis drive device 144 for moving up and down the component holding device 100 in a Z-axis direction, and a rotary drive device 146 for rotating the component holding device 100 about its axis. The component holding device 100, the Z-axis drive device 144 and the rotary drive device 146 constitute a component mounting unit 148. The component mounting device 18 in the present electronic-component mounting system includes three component mounting units 148 that are disposed on the Y-axis slide 122 such that the units 148 are arranged in a row in the Y-axis direction. However, the units 148 may be arranged in a different manner, and a different number of units 148 may be employed.

Figure 7:
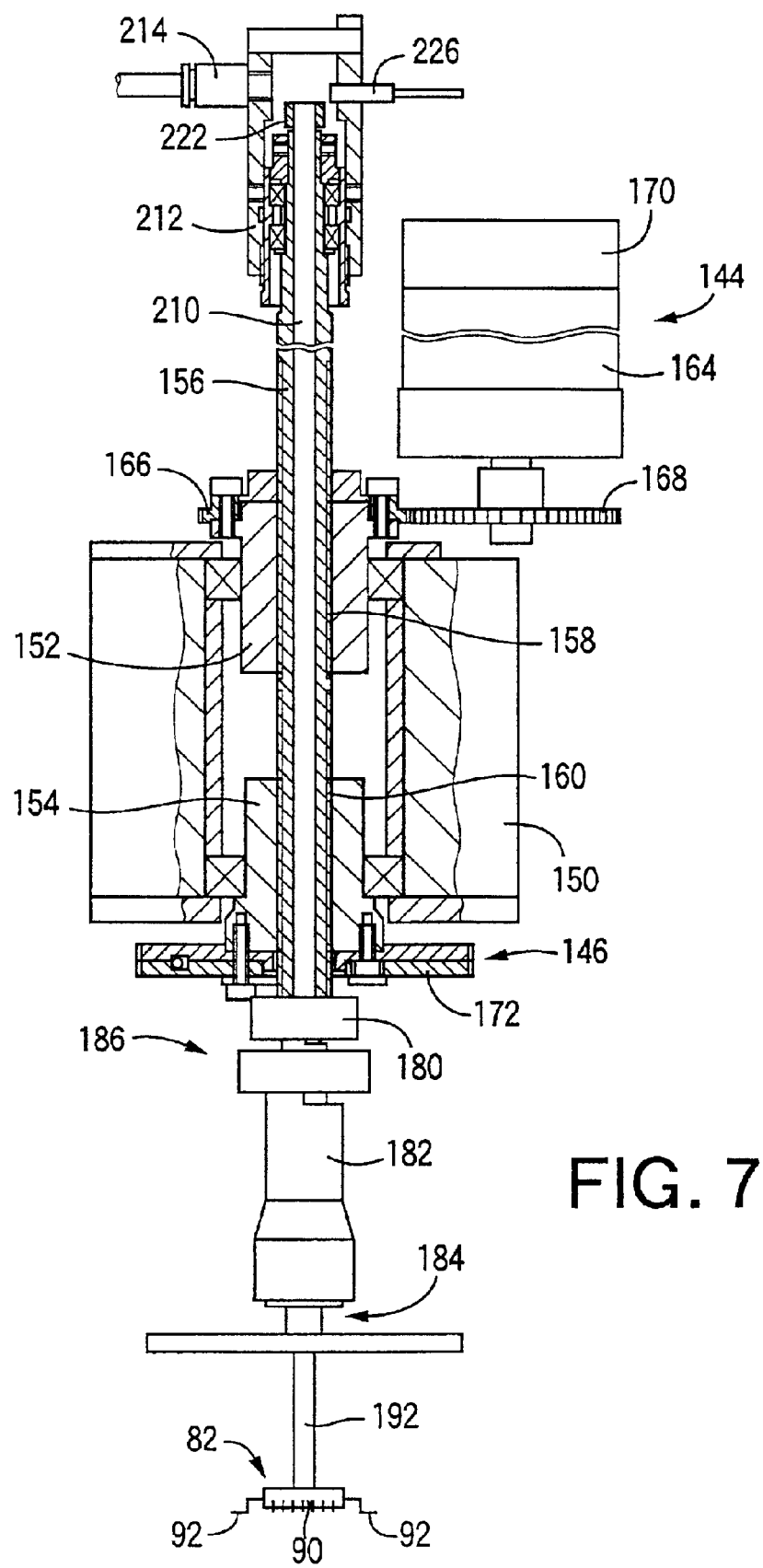
FIG. 7 is a side elevational view, partly in cross section, showing a component mounting unit of the component mounting device of FIG. 3.

Each of the component mounting units 148 in the present embodiment is identical with a component mounting unit as disclosed in Japanese patent document No. 4-372199. The component mounting unit will be described only briefly. The Y-axis slide 122 carries a support portion 150 mounted on the side surface 140. As shown in FIG. 7, the support portion 150 supports a nut 152 and a splined member 154 such that the nut 152 and splined member 154 are coaxial with each other, spaced apart from each other in the axial direction, and rotatable about their axis of rotation extending in the vertical or Z-axis direction. The nut 152 engages an externally threaded portion 158 of a hollow rod 156 while the splined member 154 engages a splined portion 160 of the hollow rod 156. The splined portion 160 is formed below the externally threaded portion 158. The nut 152 and splined member 154 are ballnut and ball-splined member which hold a multiplicity of balls.

The nut 152 is rotated by a rotary drive device including a Z-axis drive motor 164 and gears 166, 168, so that the hollow rod 156 is axially moved, that is, lifted and lowered. Thus, the nut 152, gears 166, 168 and Z-axis drive motor 164 constitute the Z-axis drive device 144. The Z-axis drive device 144 arranged to move the hollow rod 156 in the axial direction functions to move the component holding device 100 in the axial direction, that is, in the Z-axis direction perpendicular to the component-mounting surface 28 of the printed-wiring board 12, so that the component holding device 100 is moved toward and away from the printed-wiring board 12. The amount of operation of the Z-axis drive motor 164 is detected by a rotary encoder 170.

Figure 13:
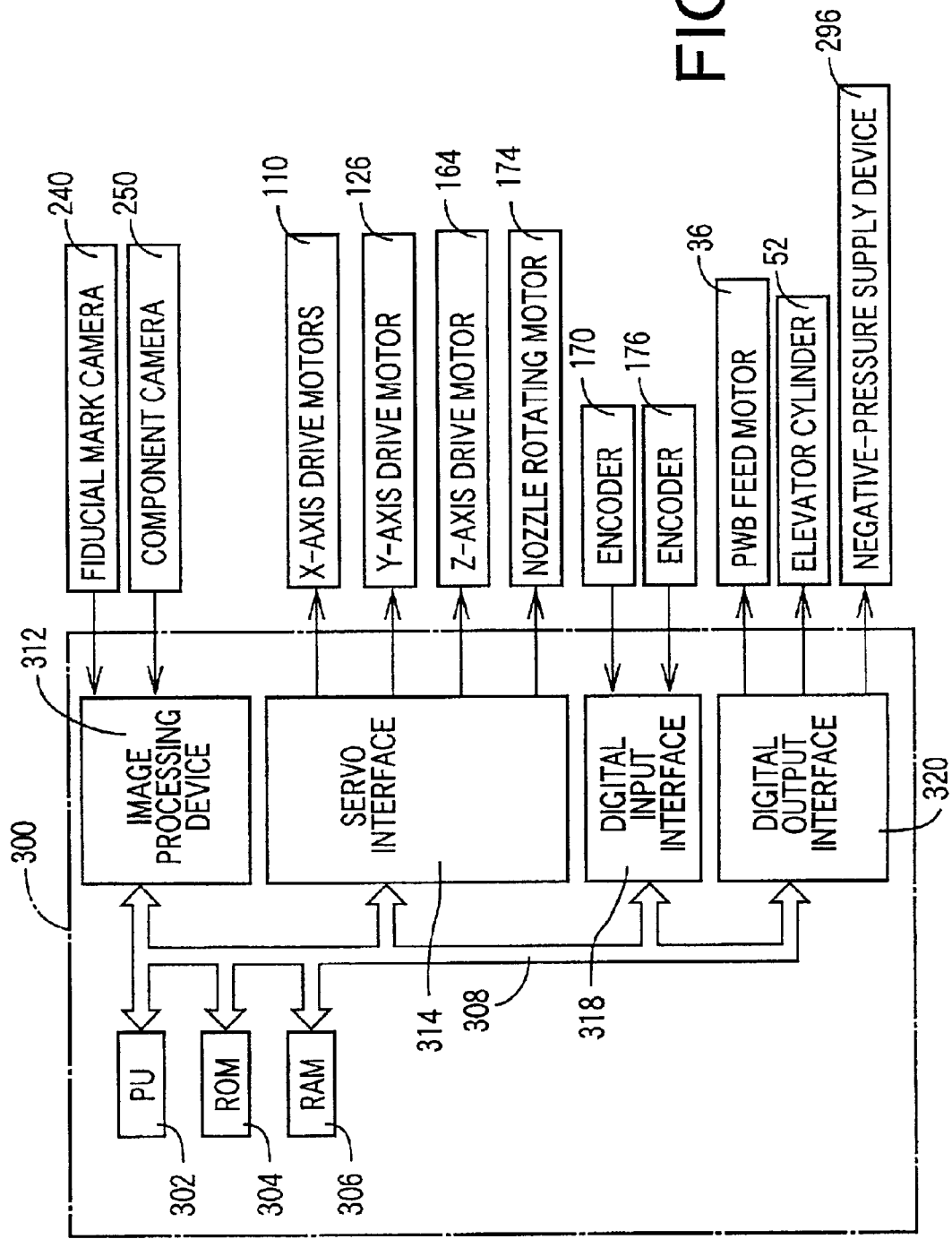
FIG. 13 is a block diagram schematically illustrating a control device of the electronic-component mounting system.

To the lower end portion of the splined member 154 which projects from the support portion 150, there is fixed a gear 172 which meshes with a gear fixed to the output shaft of a nozzle rotating motor 174 (FIG. 13). The hollow rod 156 is rotated about its axis when the splined member 154 is rotated by the nozzle rotating motor 174. Thus, the component holding device 100 is rotatable about its axis so that the electric component 82 held by the component holding device 100 can be rotated about an axis which extends in the vertical direction perpendicular to the top surface 94 of the electronic component 82, through an almost central part of the top surface 94. The amount of operation of the nozzle rotating motor 174 is detected by a rotary encoder 176 (FIG. 13).

Figure 8:
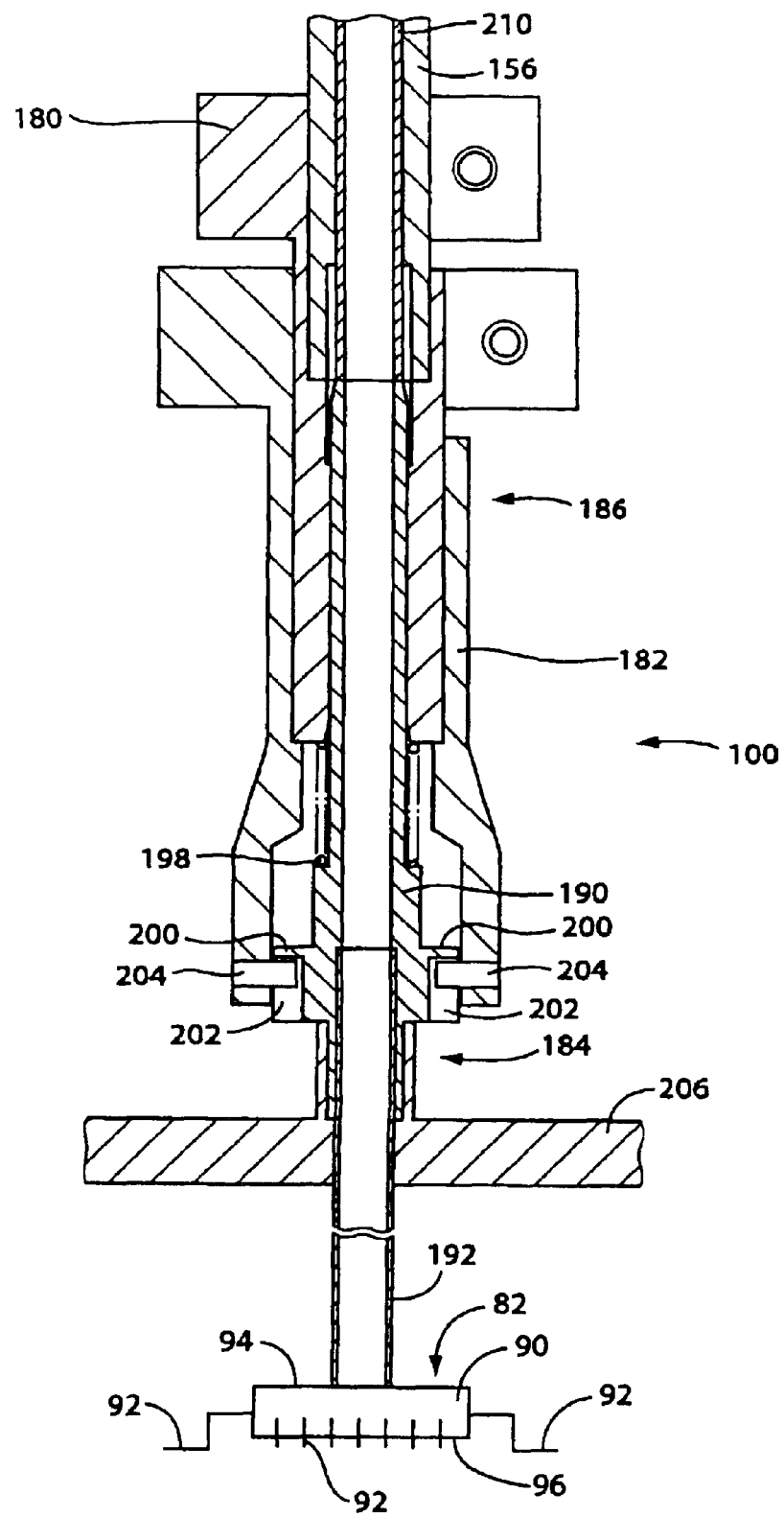
FIG. 8 is a side elevational view, in cross section, showing a component holding device of the component mounting unit of FIG. 7.

On the lower end portion of the hollow rod 156, there is removably mounted a chuck adapter 180 on which a chuck 182 is removably mounted, as shown in FIG. 8. The hollow rod 156, chuck adapter 180 and chuck 182 constitute a nozzle holder 186 for removably holding a suction nozzle 184. The nozzle holder 186 and the suction nozzle 184 constitute the component holding device 100.

The suction nozzle 184 has a sleeve 190 and a suction pipe 192 which is partially fitted in the sleeve 190. The sleeve 190 is fitted at its upper portion in the chuck adapter 180 such that the sleeve 190 is biased by a compression coil spring 198 (hereinafter referred to simply as "spring 198") in a direction that causes an exposed lower portion of the sleeve 190 to be moved away from the lower end of the chuck adapter 180. The spring 198 is interposed between the exposed lower portion of the sleeve 190 and the lower end of the chuck adapter 180. The exposed lower portion of the sleeve 190 has a pair of radially extending lugs 200, which are opposite to each other in a diametric direction of the sleeve 190 and which has a pair of slant surfaces 202 lying in the same plane. The chuck 182 has a pair of pins 204 which engage the respective slant surfaces 202, so that the suction nozzle 184 is held by the chuck 182 such that the suction nozzle 184 is not axially movable and not rotatable relative to the chuck 180. The spring 198 serves as a biasing device in the form of an elastic member.

A light emitting plate 206 is fixedly mounted on the outer circumferential surface of the lower end portion of the sleeve 190 which is located outside the chuck 182, while the suction pipe 192 is partially fitted in the inner circumferential surface of the lower end portion of the sleeve 190, such that the suction pipe 192 extends downwards through the light emitting plate 206. When the position of the electronic component 82 held by the suction nozzle 184 is detected, the light emitting plate 206 receives an ultraviolet radiation, and generates a visible light toward the electronic component 82.

The suction nozzle 184 is arranged to hold the electronic component 82 by suction under a negative pressure, when the electronic component 82 is mounted on the printed-wiring board 12. To this end, the suction nozzle 184 is connected to a negative pressure source, a positive pressure source and the atmosphere, through: a pipe 210 which is axially movably fitted in the hollow rod 156, as shown in FIG. 7; a housing 212 fixed to the upper end portion of the pipe 210 which extends from the hollow rod 156, as also shown in FIG. 7; a nipple 214 attached to the housing 212; and a solenoid-operated directional control valve (not shown). With a switching action of the solenoid-operated directional control valve, the suction pipe 192 is selectively communicated with one of the negative pressure source, positive pressure source and atmosphere. When a negative pressure is applied from the negative pressure source to the suction pipe 192, the electronic component 82 is held by suction at the top surface 94 of its body 90 by the sucking end of the suction pipe 192. When a positive pressure is applied from the positive pressure source to the suction pipe 192, the electronic component 82 is released from the suction pipe 192. In the present embodiment, the suction nozzle 184 is arranged to hold the electronic component 82 in its horizontal attitude.

The pipe 210 is held, by its own weight, in abutting contact with the upper end face of the sleeve 190 of the suction nozzle 184 which is held by the nozzle holder 186, as shown in FIG. 8. In this state, the pipe 210 is lifted and lowered with the suction nozzle 184. In the present embodiment, initiation of a relative movement between the nozzle holder 186 and the suction nozzle 184 is detected on the basis of a movement of the pipe 210. To this end, the pipe 210 is provided at its upper end with a reflector dog 222 fixed thereto, and a photoelectric switch 226 is fixedly disposed at an upper portion of the housing 212, as shown in FIG. 7.

When the component mounting device 18 is not in operation to mount the electronic component 82, the reflector dog 222 is located below the photoelectric switch 226. In the present embodiment, the photoelectric switch 226 is of a reflection type which includes a light emitter and a light receiver and which generates an ON signal when a portion of the light emitted from the light emitter is reflected by the reflector dog 222 and received by the light receiver, and an OFF signal when the light emitted from the light emitter is not reflected by the reflector dog 222 and is not received by the light receiver. When the suction nozzle 184 is located at its lowermost position relative to the nozzle holder 186, therefore, the light emitted from the photoelectric switch 226 is not reflected by the reflector dog 222 and is not received by the photoelectric switch 226, so that the OFF signal is generated. When the suction nozzle 184 is moved upwards by a small distance from the lowermost position toward the nozzle holder 186, the emitted light is reflected by the dog 222, so that the ON signal is generated by the photoelectric switch 226. Thus, the initiation of the relative movement of the suction nozzle 184 and the nozzle holder 186 can be detected by the photoelectric switch 226. In the present embodiment, the pipe 210, reflector dog 222 and photoelectric switch 226 cooperate with each other to constitute a detecting device for detecting the initiation of a movement of the suction nozzle 184 relative to the nozzle holder 186.

A plurality of kinds of suction nozzles 184 are used to mount a plurality of kinds of electronic components 82 on the printed-wiring board 12. The different kinds of electronic components 82 usually have different sizes (at least one of the cross sectional area and the height dimension). Depending upon the sizes of the electronic components 82 of different kinds, the different kinds of the suction nozzles 184 whose suction pipes 192 have different diameters are used. Accordingly, the different kinds of the suction nozzle 184 whose suction pipes 192 have the respective different diameters are accommodated in a nozzle storage device, not shown, and are selectively used depending upon the kinds of the electronic components 82 to be mounted on the board 12. The suction pipes 192 having different diameters may have accordingly different lengths. For easier understanding of the present invention, the following description is based on an assumption that the suction pipes 192 of the suction nozzle 184 of different kinds have the same length.

The Y-axis slide 122 further carries a stationary image-taking device in the form of a fiducial mark camera 240 operable to take an image of each of fiducial marks provided on the printed-wiring board 12, as shown in FIG. 1. In the present embodiment, the fiducial mark camera 240 is a CCD camera including CCDs (charge-coupled devices) and a lens system and capable of taking a two-dimensional image of an object. An illuminating device 242 is provided to illuminate each fiducial mark on the board 12, and its vicinity, when the image of the fiducial mark is taken by the fiducial mark camera 240.

The X-axis slide 106 is provided with two stationary image-taking devices 248, which are disposed at respective Y-axis positions at which the respective two ballscrews 104 are disposed. Namely, one of the two image-taking devices 248 is located between the component supply device 20 of feeder type and the PWB conveyor 14 (or the printed-wiring board 12 placed thereon), while the other image-taking device 248 is located between the component supply device 22 of tray type and the PWB conveyor 14. The two image-taking devices 248 are identical in construction with each other.

Each image-taking device 248 includes a component camera 250 for taking an image of the electronic component 82, and a waveguide device 251. The waveguide device 251 includes a reflecting device in the form of reflecting mirrors 252, 254, which are attached through respective brackets to the underside of the X-axis slide 106. The reflecting mirror 252 is disposed at a position within a path of movement of the component holding device 100 in the Y-axis direction, and has a reflecting surface 256 which is inclined about 45° with respect to a vertical plane including the centerline of the suction nozzle 184, such that one of the opposite ends of the reflecting surface 256 (as viewed in the X-axis direction) which is closer to the X-axis slide 106 is the lower end, that is, the left end of the reflecting surface 256 is the lower end.

The other reflecting mirror 254 is disposed on the side of the X-axis slide 106 which is remote from the reflecting mirror 252, and has a reflecting surface 258 which is inclined with respect to the vertical plane, symmetrically with the reflecting surface 256. The component camera 250 for taking the image of the electronic component 82 held by the suction nozzle 184 is located on the side of the X-axis slide 106 remote from the component holding device 100, such that the component camera 250 faces downwards toward the reflecting surface 258 of the reflecting mirror 254. In this arrangement, the image of the electronic component 82 held by the suction nozzle 184 can be taken by the component camera 250 when the component holding device 100 is moved by the XY positioning device 136 to the Y-axis position of the corresponding ballscrew 104 at which the electronic component 82 is located right above the reflecting mirror 252. Thus, the image-taking device 248 is arranged to image the electronic component 82 located at a predetermined image-taking position which lies within a path of movement of the electronic component 82 when the Y-axis slide 122 is moved in the Y-axis direction relative to the X-axis slide 106. In the present embodiment, the component camera 250 is a two-dimensional CCD camera, like the fiducial mark camera 240 described above. The reflecting mirror 254 may be eliminated. In this case, the component camera 250 is disposed so as to have a horizontal attitude and face toward the reflecting mirror 252. At least one of the fiducial camera 240 and the component camera 250 may be provided by a line scanning camera.

A strobe light 260 as a UV irradiating device is disposed near the reflecting mirror 252, for irradiating the light emitting plate 206 of the suction nozzle 184 with an ultraviolet radiation. The light emitting plate 206 absorbs the ultraviolet radiation, and emits a visible light for illuminating the top surface 94 of the electronic component 82 held by the suction nozzle 184. The component camera 250 takes a silhouette image of the electronic component 82 in the axis direction of the suction nozzle 184, with the light emitting plate 206 used as a light background. In the present embodiment, the light emitting plate 206 and the strobe light 260 provided as the UV irradiating device cooperate to constitute an illuminating device for the image-taking device 248. Another strobe light 262 for emitting a visible light is disposed nearer to the suction nozzle 184 than the above-indicated strobe light 260. This strobe light 262 serves as an illuminating device for illuminating the ball-grid array at a relatively small angle with respect to the bottom surface 96 of the electronic component 82. The strobe light 260 may be used as an illuminating device for irradiating the bottom surface 96 of the electronic component 82 with a visible light, for taking a normal image of the electronic component 82 rather than a silhouette image. If necessary, the image-taking device 248 may use two illuminating devices which are selectively used for taking the silhouette image and the normal image of the electronic component 82, respectively.

Two calibration platforms 266, 268 are provided at respective diagonally opposite corners of a rectangular region in which the component holding device 100 can be moved by the moving device 136. In the present embodiment, as shown in FIG. 1, the first calibration platform 266 is provided in the vicinity of one end of one ballscrew 104, located on the side of the first component supply device 20, that is nearer to the corresponding X-axis drive motor 110; and the second calibration platform 268 is provided in the vicinity of one end of the other ballscrew 104, located on the side of the second component supply device 22, that is remote from the corresponding X-axis drive motor 110. Thus, the first calibration platform 266 is provided in the vicinity of the zero point of movement of each of the X-axis slide 106 and the Y-axis slide 122; and the second calibration platform 268 is provided as distant as possible from the zero point.

The ballscrews 104 are supported by the machine base 10 such that one end portion of each of the ballscrews 104 that is rotated by a corresponding one of the X-axis drive motors 110 is rotatable, and is not movable in an axis direction of the each screw 104 and the other end portion of the screw 104 is rotatable and movable in the axial direction; and the ballscrew 120 is supported by the X-axis slide 106 such that one end portion of the ballscrew 120 that is rotated by the Y-axis drive motor 126 is rotatable, and is not movable in an axis direction of the screw 120 and the other end portion of the screw 120 is rotatable and movable in the axis direction. Accordingly, the amounts of thermal deformation and elastic deformation of the ballscrews 104, 120 are smaller at their end portions near to the first calibration platform 266, than those at their end portion near to the second calibration platform 268. The first calibration platform 266 is desirably located at a position at which the thermal deformation and elastic deformation of the ballscrews 104, 120 are negligibly small. However, the two calibration platforms 266, 268 may be located near respective diagonally opposite corners of the rectangular printed-wiring board 12 supported by the printed-wiring board support device 26. In this case, the two diagonally opposite corners of the board 12 correspond to the above-indicated two corners of the rectangular region of movement of the component holding device 100.

Figure 9:
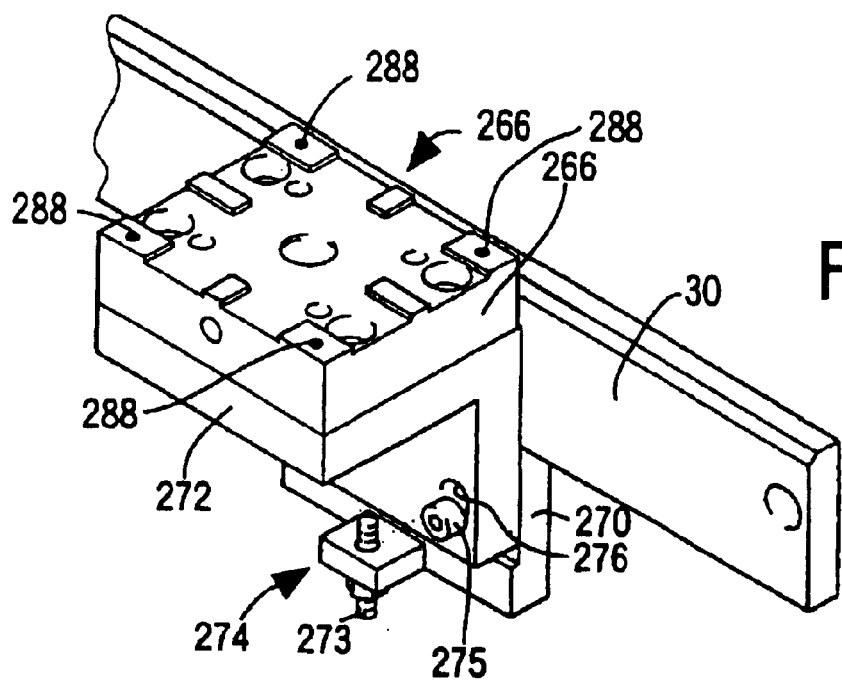
FIG. 9 is a perspective view of a calibration platform for the component mounting unit, and an attaching device for attaching the calibration platform.
Figure 10:
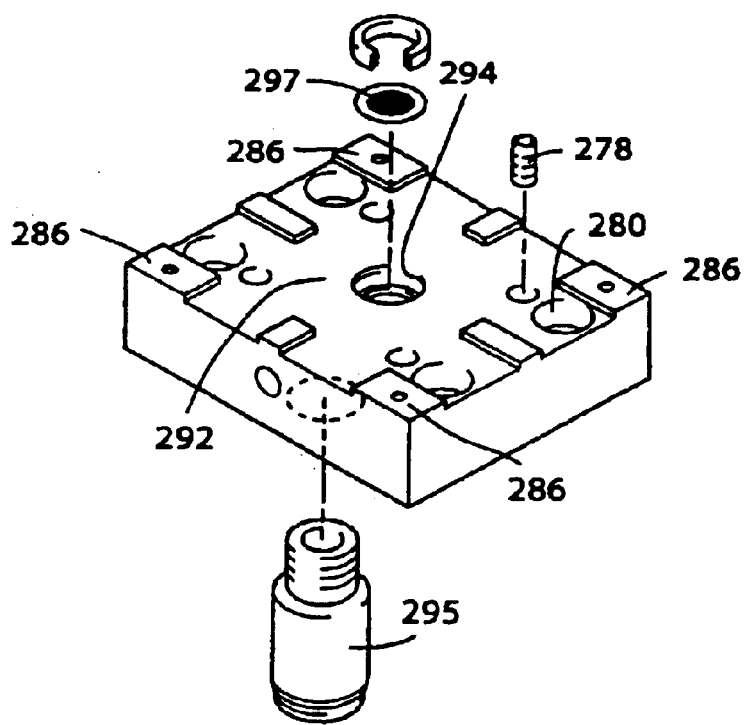
FIG. 10 is an exploded, perspective view of the calibration platform of FIG. 9.
Figure 11:
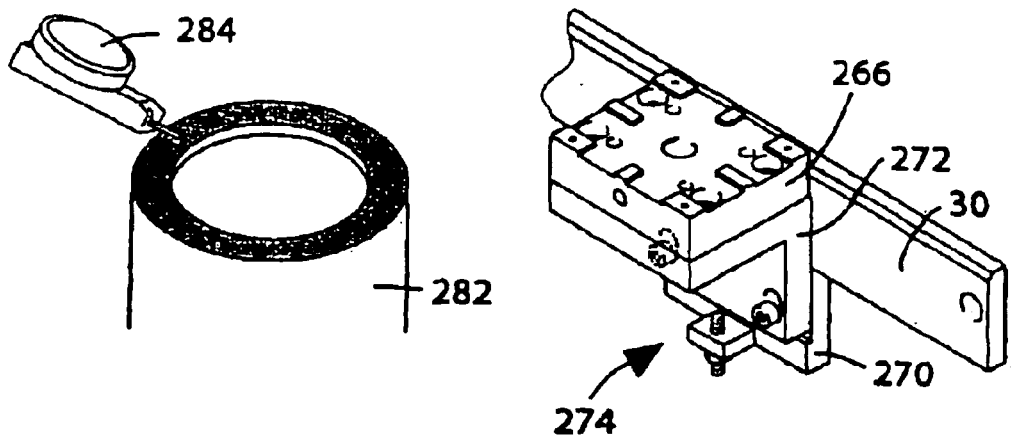
FIG. 11 is a perspective view for explaining a manner in which a height position of the calibration platform is adjusted.

As shown in FIG. 9, the first calibration platform 266 is fixed to the stationary guide rail 30 of the PWB conveyor 14. A first bracket 270 is fixed to the guide rail 30, and a second bracket 272 is attached to the first bracket 270 such that a height position of the second bracket 272 is adjustable by cooperation of a height-position adjusting device 274 including an adjustor bolt 273, a pair of bolts 275, and a pair of elongate holes 276. As shown in FIG. 10, the calibration platform 266 is provided with three or more adjustor screws 278 (four adjustor screws 278 are employed in the present embodiment) that are screwed to adjust a height position of the calibration platform 266 relative to the second bracket 272. The calibration platform 266 is additionally provided with three or more bolt holes 280 in which respective bolts, not shown, are screwed to fasten the platform 266 to the bracket 272 with the height position of the platform 266 being adjusted relative to the bracket 272. The height position of the calibration platform 266 relative to the second bracket 272 is adjusted, as shown in FIG. 11, by, first, placing a height-position gauge 282 on the machine base 10, then attaching a dial gauge 284 to the nozzle holder 186, and subsequently adjusting the adjustor screws 278 so that an upper surface of the height-position gauge 282 is level with each of three or more reference surfaces 286 (four reference surfaces 286 are employed in the present embodiment) of the calibration platform 266. Thus, the respective height positions of the reference surfaces 286 are adjusted to be level with the upper surface of the printed-wiring board 12 supported by the support device 26, i.e., the component-mounting surface 28 on which the electronic components 82 are to be mounted. The height-position gauge 282 is so designed as to assure that.

Figure 12:
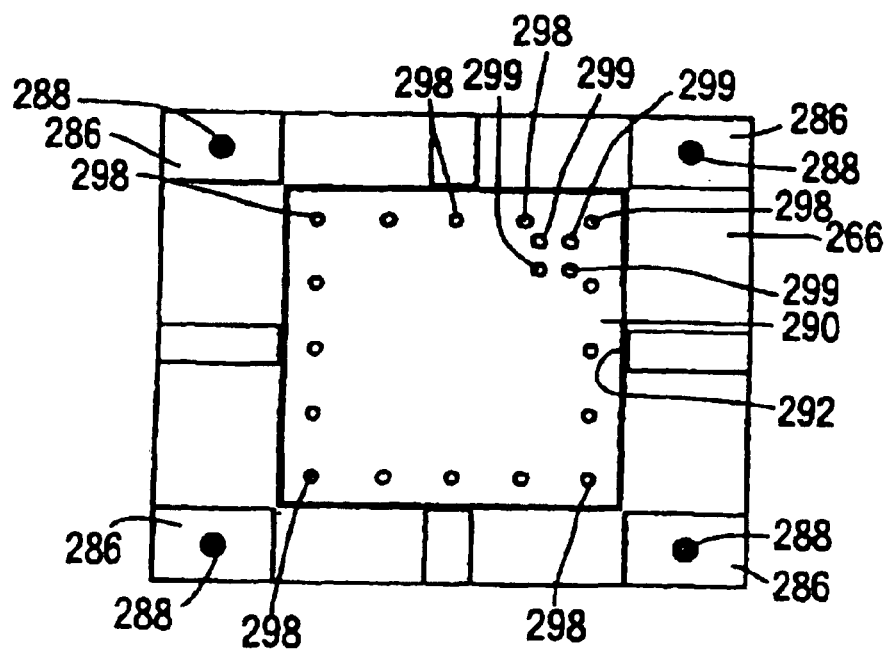
FIG. 12 is a plan view of the calibration platform.

The four reference surfaces 286 have respective reference marks 288. Each of the reference marks 288 has an optical characteristic different from that of each of the reference surfaces 286. Preferably each reference surface 286 is one of white and black and each reference mark 288 is the other of white and black. Each reference mark 288 may have any shape but preferably has such a shape that assures that the mark 288 is easily detectable to determine a position thereof. In the example shown in FIG. 11, each reference mark 288 has a circular shape. However, each reference surface 286 may have a hole as a reference mark. As shown in FIG. 12, a calibration gauge 290 is placed on the upper surface of the calibration platform 266. To this end, the calibration platform 266 has a recessed support surface 292 which can support, with more or less allowance, the calibration gauge 290. A depth of the recessed support surface 292 is determined to be equal to a thickness of the calibration gauge 290, and accordingly, in the state in which the surface 292 supports the gauge 290, an upper surface of the gauge 290 is level with the reference surfaces 286. The calibration platform 266 has a suction hole 294 which is formed through a central portion of the support surface 292 and is connected to a negative-pressure supply device 296 (FIG. 13) via a joint 295. The suction hole 294 is provided with a filter 297.

Although detailed description and illustration of the second calibration platform 268 are omitted, the second calibration platform 268 has a construction identical with that of the first calibration platform 266, except that the second platform 268 is fixed to not the stationary guide rail 30 of the PWB conveyor 14 but the machine base 10. However, the calibration gauge 290 is commonly used with the first and second calibration platforms 266, 268 and normally the gauge 290 is kept on the first platform 266. Each of the calibration platforms 266, 268 may be formed of any material such as metal, ceramics, or synthetic resin. However, preferably, each platform 266, 268 is formed of a material having a small coefficient of thermal expansion. In the present embodiment, each platform 266, 268 is formed of a steel having a small coefficient of thermal expansion and available under the commercial name of "NI-RESIST".

The calibration gauge 290 may have any shape, preferably a rectangular shape (a square shape in the present embodiment). The gauge 290 has a plurality of groups of reference holes 298, 299. The first group of reference holes 298 are formed in an outer peripheral portion of the gauge 290, along the four sides of the square shape thereof. The second group of reference holes 299 are formed in one corner of the gauge 290, such that four holes 299 are located at four vertices of a small square, respectively. However, the respective numbers of the first reference holes 298 and the second reference holes 299 are not limited to those employed in the present embodiment, but may be any numbers so long as they are greater than one. For example, two first reference holes 298 may be provided on one diagonal line of the gauge 290, and two second reference holes 299 may be provided on the same diagonal line. In the case where the gauge 290 has two first reference holes 298 and two second reference holes 299, one of the two first holes 298 may also function as one of the two second holes 299. Generally, a portion of the first group of reference holes 298 may also function as a portion of the second group of reference holes 299. Each of the fiducial mark camera 240 and the component cameras 250 can be changed with respect to its magnifying power. The first group of reference holes 298 are useful when each camera 240, 250 takes an image at a low magnifying power; and the second group of reference holes 299 are useful when each camera 240, 250 takes an image at a high magnifying power. The calibration gauge 290 is formed of any material such as metal (e.g., stainless steel), ceramics, or synthetic resin, preferably, a material having a small coefficient of thermal expansion. In the present embodiment, the gauge 290 is formed of a white ceramics. Therefore, a normal image of the gauge 290 that is formed by a light reflected from a front surface thereof includes respective dark images of the reference holes 298, 299 in the light background; and a silhouette image of the gauge 290 that is formed by a light incident to a back surface thereof includes respective light images of the reference holes 298, 299 in the dark background.

Thus, in the present embodiment, the calibration platforms 266, 268 and the calibration gauge 290 have the reference marks 288 and the reference holes 298, 299, respectively, and respective images of the platforms 266, 268 and the gauge 290 are taken to detect respective positions of the same 266, 268, 290. However, this is not essentially required. For example, respective images of respective edge lines of the calibration platforms 266, 268 and the calibration gauge 290 may be taken to detect respective positions of the same 266, 268, 290.

The present electronic-component mounting system is provided with control means in the form of a control device 300 illustrated in FIG. 13. The control device 300 is principally constituted by a computer incorporating a processing unit (PU) 302, a read-only memory (ROM) 304, a random-access memory (RAM) 306, and a bus 308 interconnecting those elements 302, 304, 306. The bus 308 is connected to an image processing device 312 to which are connected the fiducial mark camera 240 and component camera 250 which have been described above. The bus 308 is also connected to a servo interface 314 to which are connected various actuators such as the X-axis drive motors 110, Y-axis drive motor 126, Z-axis drive motor 164 and nozzle rotating motor 174. In the present embodiment, the X-axis drive motors 110 are servo motors. However, the X-axis drive motors may be electric motors of other types such as stepping motors, as long as the amount of operation of the electric motors can be controlled.

The bus 308 is also connected to a digital input interface 318 and a digital output interface 320. To the digital input interface 318, there are connected the encoders 170, 176 described above, and other encoders such as those for detecting the amounts of operation of the X-axis drive motors 110. To the digital output interface 320, there are connected the printed-wiring board feed motor (PWB feed motor) 36, a control valve for the elevator cylinder 52, the negative-pressure supply device 296, and other actuators. The RAM 306 stores various control programs such as those for executing a main control routine, not shown, a first automatic-calibration control routine shown in FIG. 14, a second automatic-calibration control routine shown in FIG. 15, and an electronic-component-mounting control routine. The control device 300 also controls the image taking operations of the fiducial mark camera 240 and the image-taking devices 248, although not illustrated in FIG. 13.

Figure 16:
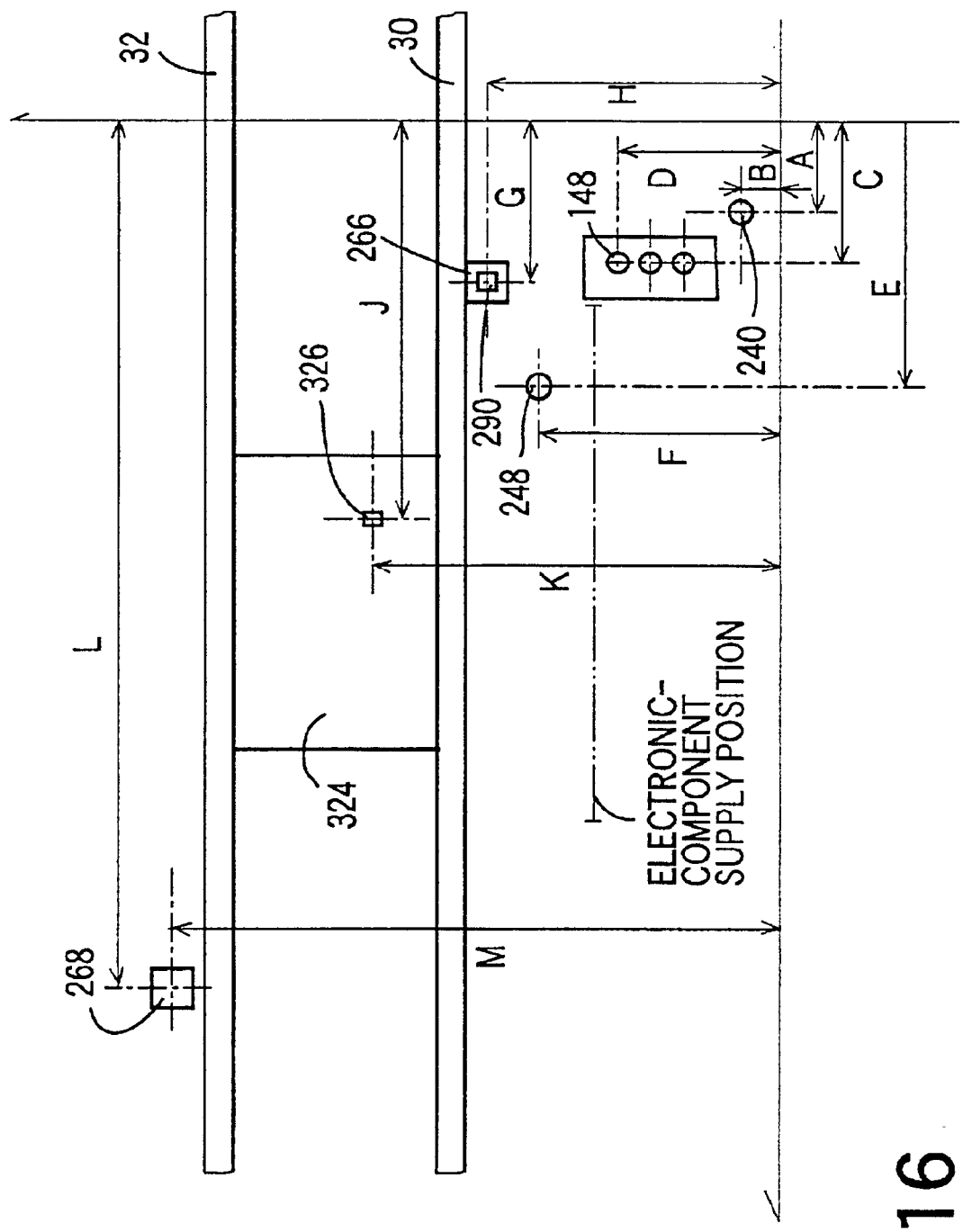
FIG. 16 is an illustrative view for explaining an operation of the electronic-component mounting system.

The present electronic-component mounting system is arranged to obtain actual relative positions of those sections of the system which influence the component mounting accuracy, and compensate the position of the electronic component 82 for deviations of the obtained actual relative positions with respect to the nominal relative positions, before mounting of the electric component 82 on the printed-wiring board 12, in order to avoid deterioration of the component mounting accuracy due to the deviations. Described in more detail, the electric-component mounting system is adapted to automatically detect the amounts and directions of deviations of the actual relative positions among the image-taking devices 248 (each consisting of the component camera 250 and waveguide device 251), the fiducial mark camera 240 and the suction nozzle 184, with respect to the nominal relative positions, so that the position of the electronic component 82 is compensated for the detected deviations, before the electronic component 82 is mounted on the printed-wiring board 12. In the present embodiment, the positions of the image-taking devices 248 and fiducial mark camera 240 are represented by the positions of their optical axes, that is, by the center points of the imaging areas of the image-taking devices 248 and fiducial mark camera 240. The present embodiment is further arranged such that the positions of the fiducial mark camera 240 and the suction nozzle 184 are defined with respect to the center point of the imaging area of each image-taking device 248 in the XY coordinate system, shown in FIG. 16, in which the X-axis and Y-axis slides 106, 122 are moved in the X-axis and Y-axis directions. The XY coordinate system has the zero point (0, 0) which is located at one corner of the rectangular region of movements of the slides 106, 122, which corner is nearest to the X-axis drive motors 110 and the Y-axis drive motor 126. In FIG. 16, respective distances of various elements from the zero point (0, 0) are indicated at symbols "A" to "M", and respective coordinate points representing respective positions of the elements are stored, in the RAM 306, as part of characteristic values of the present electronic-component mounting system.

First, the first automatic-calibration control routine of FIG. 14 will be described. At Step S1, the control device 300 operates the PWB conveyor 14 to carry in a standard substrate 324, and operates the PWB support device 26 to support the standard substrate 324 at a predetermined position. Then, at Step S2, the suction nozzle 184 receives a standard chip 326 from one of the component feeders 70 of the component supply device 22. In the present embodiment, the standard chip 326 is a special chip that is specially produced for calibration. However, it is possible to use, in place of the standard chip 326, a sort of electronic component 82 for being mounted on a printed-wiring board 12. At Step S3, the suction nozzle 184 holding, by suction, the standard chip 326 is moved to, and stopped at, the coordinate point (E, F) representing the predetermined position of the optical axis of one of the image taking devices 248. This coordinate point is recognized by the control device 300 based on respective output signals supplied from the respective encoders associated with the X-axis and Y-axis drive motors 110, 126. If the present electronic-component mounting system is accurately manufactured according to the design drawing, the rotation axis of the suction nozzle 184, i.e., the rotation axis of the component holder 186 should coincide with the optical axis of the image taking device 248, i.e., the center point of the imaging area thereof. However, in fact, usually, the rotation axis of the suction nozzle 184, i.e., the rotation axis of the component holder 186 more or less deviates from the optical axis of the image taking device 248. The image taking device 248 takes an image of the standard chip 326 held by the suction nozzle 184 being stopped, and supplies a batch of image data representing the taken image, to the image processing device 312, which processes the image data in a known image-processing method to determine a positional error of the center point of the standard chip 326 from the center point of the imaging area of the image taking device 248.

Then, at Step S4, the suction nozzle 184 is moved to a coordinate point obtained by correcting the predetermined coordinate point (J, K) by the above-determined positional error, so that the standard chip 326 is placed on the standard substrate 324, which is formed of a steel having a low coefficient of thermal expansion and has, on its upper surface, a pressure sensitive adhesive double coated tape. Thus, the standard chip 326 placed on the standard substrate 324 is not displaced relative to the substrate 324. At Step S5, the fiducial mark camera 240 takes an image of the standard chip 326 placed on the standard substrate 324, and the image processing device 312 determines, based on the taken image, positional errors ΔX1, ΔY1 of the center point of the standard chip 326 from the center point of the imaging area of the fiducial mark camera 240. The positional errors ΔX1, ΔY1 are stored in a predetermined area of the RAM 306. The foregoing description is made, for easier understanding purposes only, on an assumption that the single standard chip 326 is placed on the standard substrate 324. In fact, however, a plurality of standard chips 326 are placed at respective positions on the standard substrate 324, and respective positional errors ΔX1, ΔY1 of the standard chips 326 are determined and stored in the RAM 306.

Steps S6 to S9 are similar to Steps S2 to S5, respectively, except that the calibration platform 266 and the calibration gauge 290 are used in place of the standard substrate 324 and the standard chip 326. Thus, positional errors ΔX2, ΔY2 of the center point of the calibration gauge 290 from the center point of the imaging area of the fiducial mark camera 240 are determined and stored in the RAM 306. In this connection, it is noted that when the calibration gauge 290 is placed on the calibration platform 266, the suction hole 294 is supplied with negative pressure at an appropriate timing around a time when the gauge 290 contacts the support surface 292 of the platform 266 and, after the gauge 290 is held by suction to the platform 266 such that the gauge 290 is effectively prevented from being displaced relative to the platform 266, the supply of negative pressure to the suction nozzle 184 is stopped to release the gauge 290. In order to quickly release the gauge 290, it is preferred to supply a positive pressure to the nozzle 184 for a very short time when the nozzle 184 is switched from its connection with the negative-pressure supply device to its connection with the atmospheric pressure. In addition, the image taking device 248 takes a silhouette image of the calibration gauge 290 that is formed by the light incident to its back surface; and the fiducial mark camera 240 takes a normal image of the gauge 290 that is formed by the light incident to its front surface. Here, the position of the center point of the calibration gauge 290 is determined or obtained as an average of respective coordinate points representing respective center positions of the four reference holes 298 provided in the four corners of the gauge 290. However, a position of a reference point of the calibration gauge 290 may be obtained based on respective coordinate points representing respective center positions of five or more reference holes 298 of the gauge 290, or based on respective coordinate points representing respective center positions of two or four reference holes 299 of the gauge 290.

At Step S10, the suction nozzle 184 holds, by suction, the calibration gauge 290 and moves the gauge 290 off the first calibration platform 266 and, at Step S11, the nozzle 184 places the gauge 290 on the second calibration platform 268. At Step S12, an image of the gauge 290 is taken by the fiducial mark camera 240, and the image processing device 312 determines, based on the taken image, positional errors ΔX3, ΔY3 of the center point of the calibration gauge 290 from the center point of the imaging area of the fiducial mark camera 240, and stores the thus determined positional errors in the RAM 306.

At Step S13, the image processing device 312 calculates first differences, ΔX1−ΔX2, ΔY1−ΔY2, as differences between the positional errors associated with the placing of an object on the first standard substrate 324 and the positional errors associated with the placing of the object on the first calibration platform 266, and calculates second differences, $\Delta X1-\Delta X3$, $\Delta Y1-\Delta Y3$, as differences between the positional errors associated with the placing of the object on the standard substrate 324 and the positional errors associated with the placing of the object on the second calibration platform 268. The thus determined first differences $\Delta X1-\Delta X2$, $\Delta Y1-\Delta Y2$ and second differences $\Delta X1-\Delta X3$, $\Delta Y1-\Delta Y3$ are stored in respective predetermined memory areas of the RAM 306. Those differences are part of the characteristic values of the present electronic-component mounting system, and will be used as part of correction values to correct a predetermined component-mounting position or place when each electronic component 82 is mounted at the predetermined component-mounting place on the printed-wiring board 12.

Figure 15:
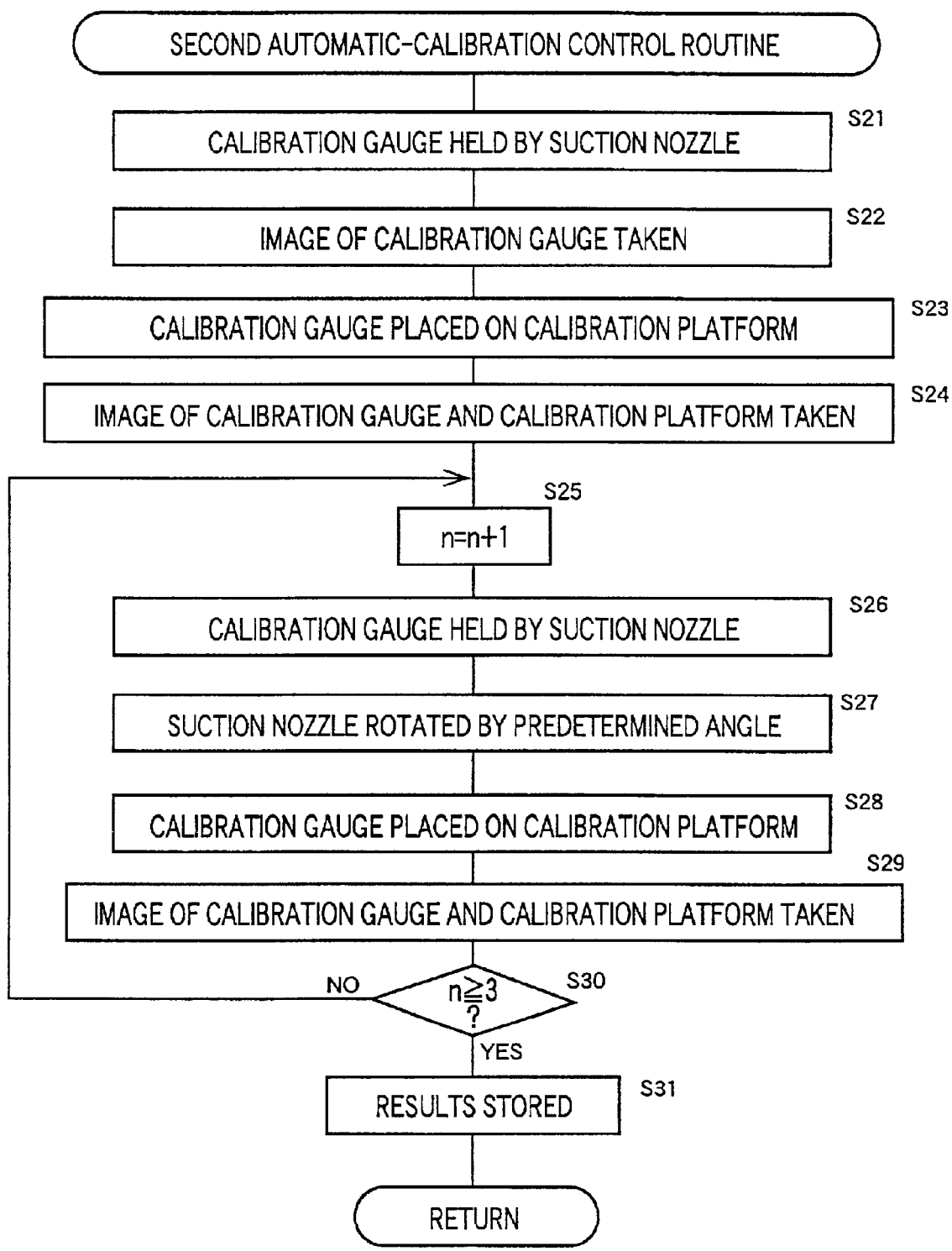
FIG. 15 is a flow chart representing another control program that is stored in the RAM of the control device.

Next, the second automatic-calibration control routine of FIG. 15 will be described. At Step S21 starting with a state in which the calibration gauge 290 is placed on the first calibration platform 266, the suction nozzle 184 is moved to the predetermined coordinate point (G, H) representing the center point of the calibration platform 266, i.e., the nominal position of the platform 266, and holds, by suction, the gauge 290. At Step S22, the suction nozzle 184 holding the gauge 290 is moved to the nominal position of the image taking device 248, and an image of the gauge 290 is taken. The image processing device 312 determines, based on the taken image, positional errors $\Delta X4$, $\Delta Y4$ of the center point of the gauge 290 from the center point of the imaging area of the component camera 250, and stores the thus determined positional errors in the RAM 306. The center point of the gauge 290 is determined as an average of respective coordinate points representing, in a coordinate system whose origin rides on the center point of the imaging area of the camera 250, respective center points of the four reference holes 298 formed in the four corners of the gauge 290. At Step S23, the suction nozzle 184 is moved to the nominal position of the first calibration platform 266, and places the calibration gauge 290 on the calibration platform 266. At Step S24, the fiducial mark camera 240 takes an image of the calibration gauge 290 and the calibration platform 266, and the image processing device 312 determines, based on the taken image, a relative position $\Delta X5$, $\Delta Y5$ of the center point of the platform 266 relative to the center point of the imaging area of the fiducial mark camera 240, and a relative position $\Delta X6$, $\Delta Y6$ of the center point of the gauge 290 relative to the center point of the imaging area of the camera 240, and stores the thus determined relative position $\Delta X5$, $\Delta Y5$ and relative position $\Delta X6$, $\Delta Y6$ in respective predetermined memory areas of the RAM 306. The center point of the platform 266 is determined as an average of respective coordinate points representing respective center points of the four reference marks 288 of the platform 266. The center point of the gauge 290 is determined as an average of respective coordinate points representing the respective center points of the four reference holes 298 of the gauge 290. Next, at Step S25, a number, n, counted by a counter is incremented by one and, at Step S26, the suction nozzle 184 is moved to the nominal position of the first calibration platform 266 to hold, by suction, the calibration gauge 290 and move the gauge 290 off the platform 266. At Step S27, the suction nozzle 184 holding the gauge 290 is rotated by a predetermined angle (e.g., 90 degrees) and, at Step S28, the nozzle 184 is moved again to the nominal position of the platform 266 to place the gauge 290 on the platform 266. At Step S29, the fiducial mark camera 240 is moved to the nominal position of the platform 266 to take an image of the gauge 290 and the platform 266, and the image processing device 312 determines, based on the taken image, relative coordinate points representing respective positions of the respective center points of the platform 266 and the gauge 290, and stores the thus determined coordinate points in the RAM 306. At Step S30, the control device 300 judges whether the number n counted by the counter is equal to, or greater than, three. Steps S25 to S29 are repeated till a positive judgment is made at Step S30. Thus, the control device 300 obtains four coordinate points representing the center point of the platform 266, and four coordinate points representing the center point of the gauge 290, when the suction nozzle 184 takes the four angular positions, e.g., 0 degree, 90 degrees, 180 degrees, 270 degrees, respectively. If a positive judgment is made at Step S30, the control goes to Step S31 to determine an average of the four coordinate points obtained for the gauge 290, as a coordinate point representing a position of the rotation axis of the nozzle 184, determine an average of the four coordinate points obtained for the platform 266, as a coordinate point representing a position of the center point of the platform 266, and determine a positional error of the rotation axis of the nozzle 184 from the center point of the platform 266. In addition, the thus determined coordinate point representing the position of the center point of the platform 266, and determined positional error of the rotation axis of the nozzle 184 are stored in respective memory areas of the RAM 306.

The thus collected data represent relative-positional errors among each of the image taking devices 248 (each essentially including the component camera 250), the fiducial mark camera 240, and the suction nozzle 184. More specifically described, the above-described average of the four coordinate points obtained for the platform 266 represents a positional error of the center point of the platform 266 relative to the center point of the fiducial mark camera 240; and the above-described positional error of the rotation axis of the nozzle 184 from the center point of the platform 266 represents a positional error of the rotation axis of the nozzle 184 relative to the center point of the platform 266. In addition, respective differences, $\Delta X5-\Delta X6$, $\Delta Y5-\Delta Y6$, between the relative position $\Delta X5$, $\Delta Y5$ of the center point of the platform 266 relative to the center point of the imaging area of the fiducial mark camera 240, and the relative position $\Delta X6$, $\Delta Y6$ of the center point of the gauge 290 relative to the center point of the imaging area of the camera 240, determined at Step S24, represent a positional error of the respective center points of the platform 266 and the gauge 290 relative to each other, and cooperate with the positional error $\Delta X4$, $\Delta Y4$ of the center point of the gauge 290 from the center point of the imaging area of the component camera 250, determined at Step S22, to represent a positional error of the center point of the platform 266 relative to the center point of the component camera 250.

Figure 17:
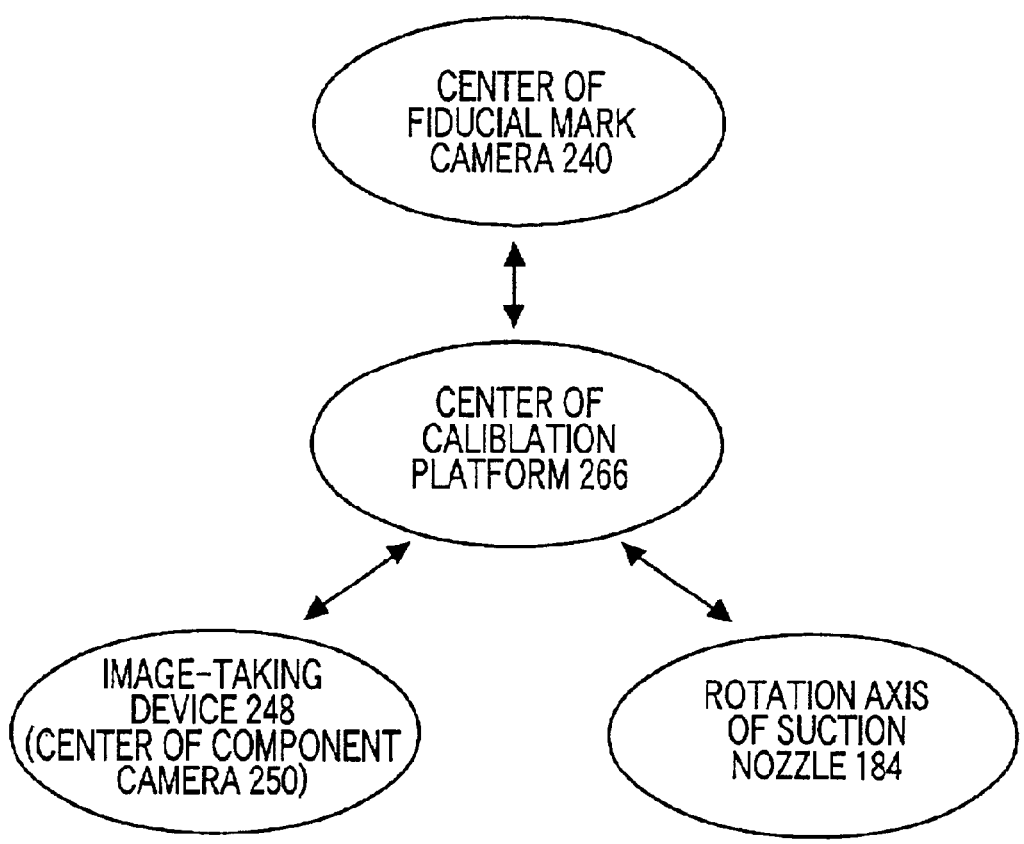
FIG. 17 is a view for explaining a technical advantage of the electronic-component mounting system.

Thus, as illustrated in FIG. 17, the control device 300 obtains respective positional errors of the center point of each image taking device 248 essentially provided by the component camera 250, the center point of the fiducial mark camera 240, and the center point of the rotation axis of the suction nozzle 184, each relative to the center point of the first calibration platform 266. In short, the control device 300 obtains respective relative-positional errors among the center point of each image taking device 248 essentially provided by the component camera 250, the center point of the fiducial mark camera 240, and the center point of the rotation axis of the suction nozzle 184. In addition, in the present embodiment, the relative-positional error between the center point of the fiducial mark camera 240 and the rotation axis of the suction nozzle 184 is obtained without a need to use the center point of each image taking device 248 essentially provided by the component camera 250, i.e., with a need to use only the center point of the first calibration platform 266 that is stationary. Thus, the relative-positional error between the center point of the fiducial mark camera 240 and the rotation axis of the suction nozzle 184 is not influenced by a positional error which is produced when an XY robot essentially provided by the X-axis slide 106 and the Y-axis slide 122 is moved.

In addition, the relative-positional error between the center point of each image taking device 248 essentially provided by the component camera 250 and the center point of the fiducial mark camera 240 is obtained with a need to use the center point of the calibration gauge 290. The thus obtained relative-positional error contains a positional error which is produced when the gauge 290 is transferred by the XY robot. In the present embodiment, however, the distance of transferring of the gauge 290 is considerably small and accordingly the positional error produced by the transferring of the gauge 290 is considerably small. Thus, the relative-positional error between the center point of each image taking device 248 and the center point of the fiducial mark camera 240 is obtained with high accuracy. Moreover, since the first calibration platform 266, the two image taking devices 248 (in particular, one image taking device 248 provided on the side of the component supply device 20), and the fiducial mark camera 240 are provided in the vicinity of the zero point or origin of the rectangular range in which the XY robot is movable, the relative-positional error between the center point of each image taking device 248 and the center point of the fiducial mark camera 240 can be detected without influences from the manufacturing errors, elastic deformations and/or thermal deformations of the ballscrews 104, 120 that increase as the respective distances thereof from the origin increase.

Figure 14:
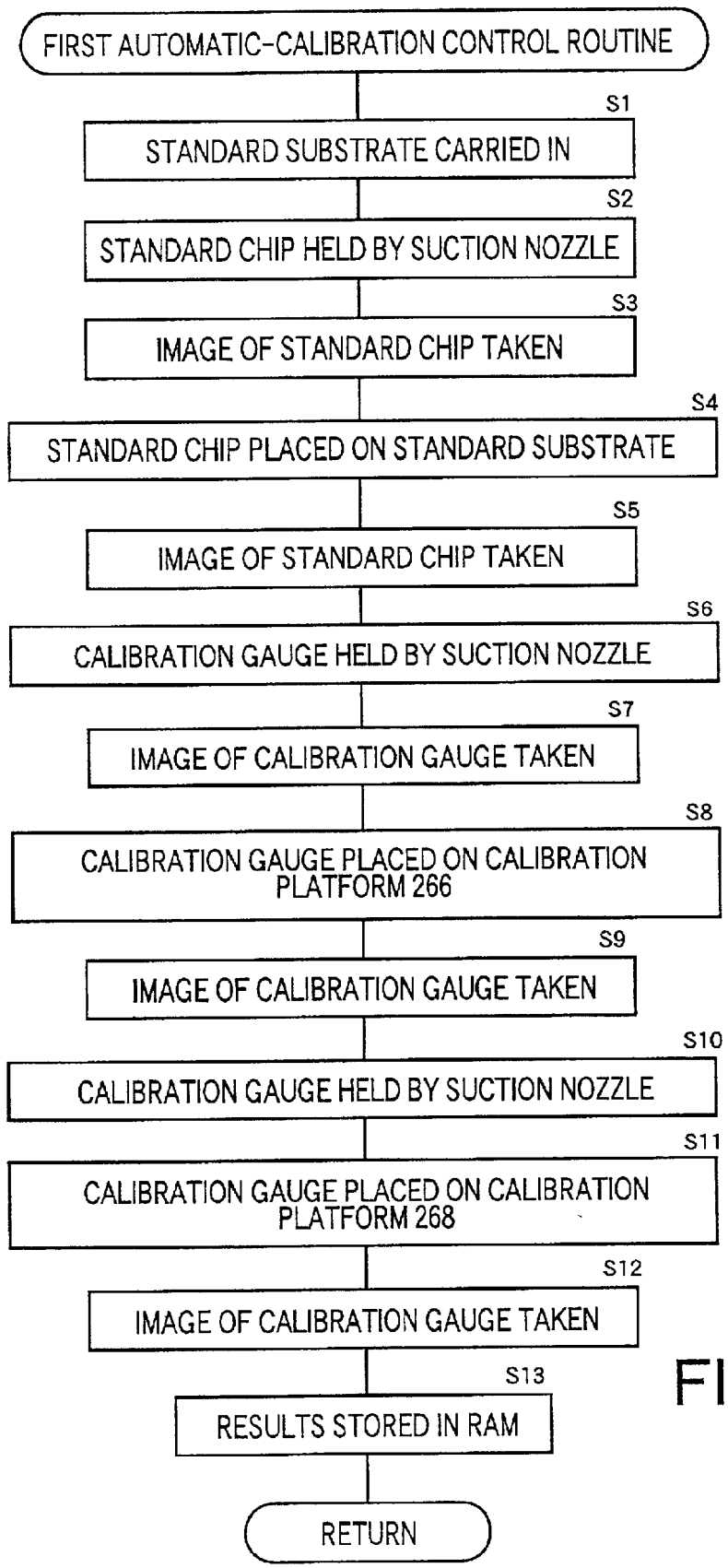
FIG. 14 is a flow chart representing a control program that is stored in a RAM (random access memory) of the control device of FIG. 13.

When the first automatic-calibration control routine of FIG. 14 is carried out, the positional error of each predetermined component-mounting place on the printed-wiring board 12 that is far from the origin for the XY robot, is obtained as described above. Therefore, when each electronic component 82 is mounted at a corresponding predetermined component-mounting place on the printed-wiring board 12, the control device 300 can correct the predetermined component-mounting place by taking into account not only the relative-positional errors among each image taking device 248, the fiducial mark camera 240, and the rotation axis of the suction nozzle 184, but also the positional error of the predetermined component-mounting place. Thus, the electronic component 82 can be mounted with highly improved accuracy. Moreover, the present electronic-component mounting system does not need any new elements for detecting the above-described positional errors, that is, can detect those errors by utilizing its conventional elements only. Therefore, the present system can be produced at low cost, can fully automatically detect those errors at an arbitrary timing during a short break between two electronic-component mounting operations, and can effectively prevent component-mounting errors resulting from the thermal deformations. For example, the present system may periodically detect those errors each time the system has been operated for a predetermined period, or may detect those errors at an appropriate timing when the error detecting operation does not interfere with the component mounting operation, so that the present system may correct the operational errors of the XY robot.

The foregoing description relates to only the case where the relative-position errors among each image taking device 248, the fiducial mark camera 240, and the rotation axis of the suction nozzle 184, as measured in the X and Y axes of the XY coordinate system parallel to the printed-wiring board 12, are detected. However, the present electronic-component mounting system can easily determine respective angular-positional errors among each image taking device 248, the fiducial mark camera 240, and the suction nozzle 184, as measured about the Z axis perpendicular to the XY coordinate system, by effectively utilizing the reference marks 288 of the calibration platforms 266, 268 and the reference holes 298, 299 of the calibration gauge 290.

In the present embodiment, the reference marks 288 of each calibration platform 266, 268 are effectively used to detect, with high accuracy, the relative-positional errors among each image taking device 248, the fiducial mark camera 240, and the rotation axis of the suction nozzle 184. However, it is possible to omit the reference marks 288. For example, in place of the reference marks 288, it is possible to use the center point of the imaging area of the fiducial mark camera 240 so as to detect the relative-positional errors among each image taking device 248, the fiducial mark camera 240, and the rotation axis of the suction nozzle 184. The modified embodiment in which the reference marks 288 are omitted is readable on the invention according to the previously-described first feature (1).

Figure 18:
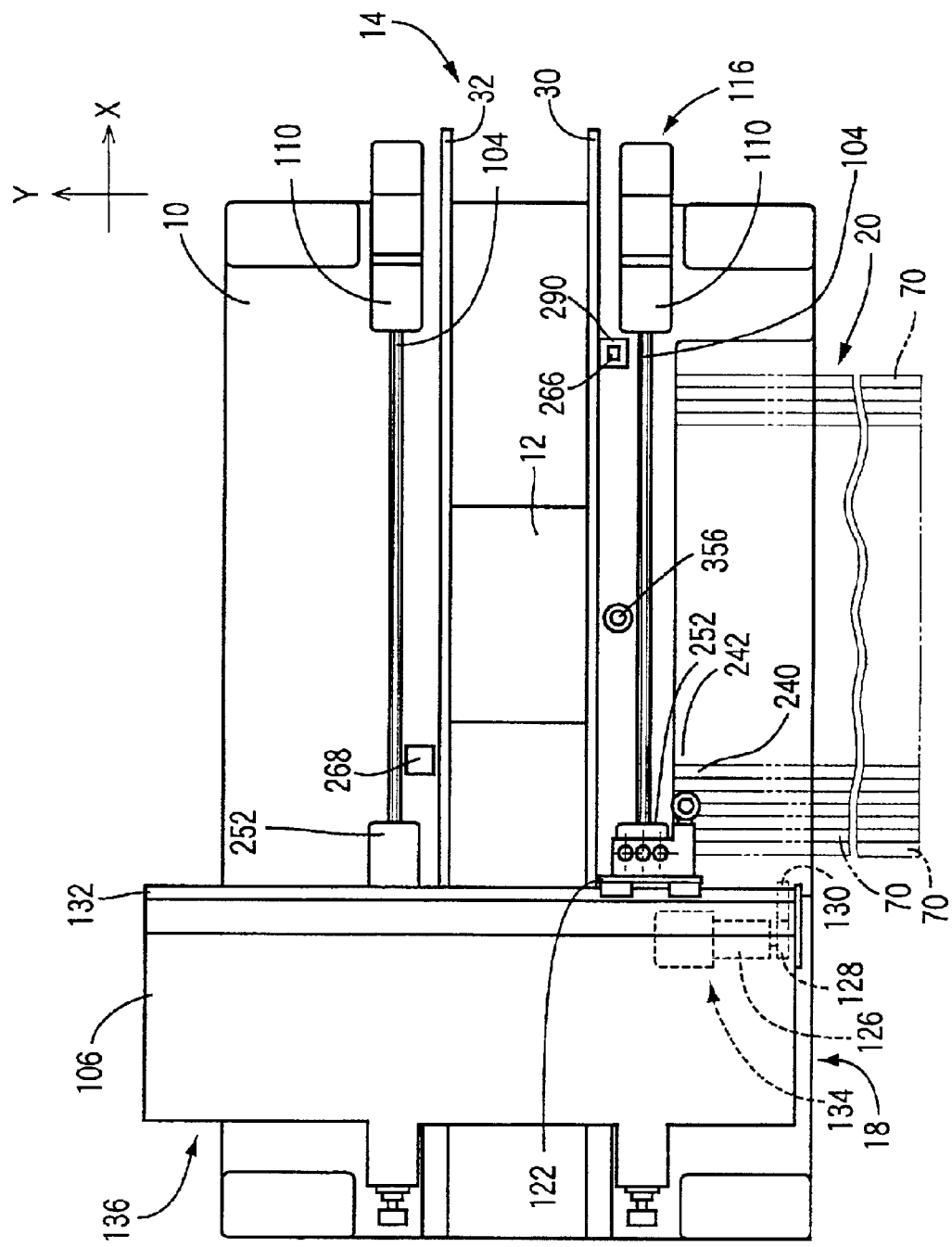
FIG. 18 is a plan view showing an electronic-component mounting system according to another embodiment of this invention.

The principle of the present invention is equally applicable to an electronic-component mounting system of a type shown in FIG. 18. The electronic-component mounting system of the embodiment of FIG. 18 is different from that of the first embodiment in that a component camera 356 of an image-taking device for obtaining a positional error of an electronic component with respect to the axis of rotation of the suction nozzle 184 is fixedly disposed on the machine base 10. Described more specifically, the component camera 356 is fixedly disposed on the machine base 10, at a position between the component supply device 20 and the PWB conveyor 14 as viewed in the Y-axis direction, and at an almost middle position of the printed-wiring board 12 supported by the support device 26, as viewed in the X-axis direction in which the board 12 is fed by the PWB conveyor 14. The suction nozzle 184 and the fiducial mark camera 240 are fixed on the Y-axis slide 122, as in the electronic-component mounting system of FIGS. 1 and 2. If the present electronic-component mounting system of FIG. 18 employs the above-described calibration platforms 266, 268 and calibration gauge 290, the system can enjoys the same advantages as those of the system shown in FIGS. 1 and 2.

Figure 19:
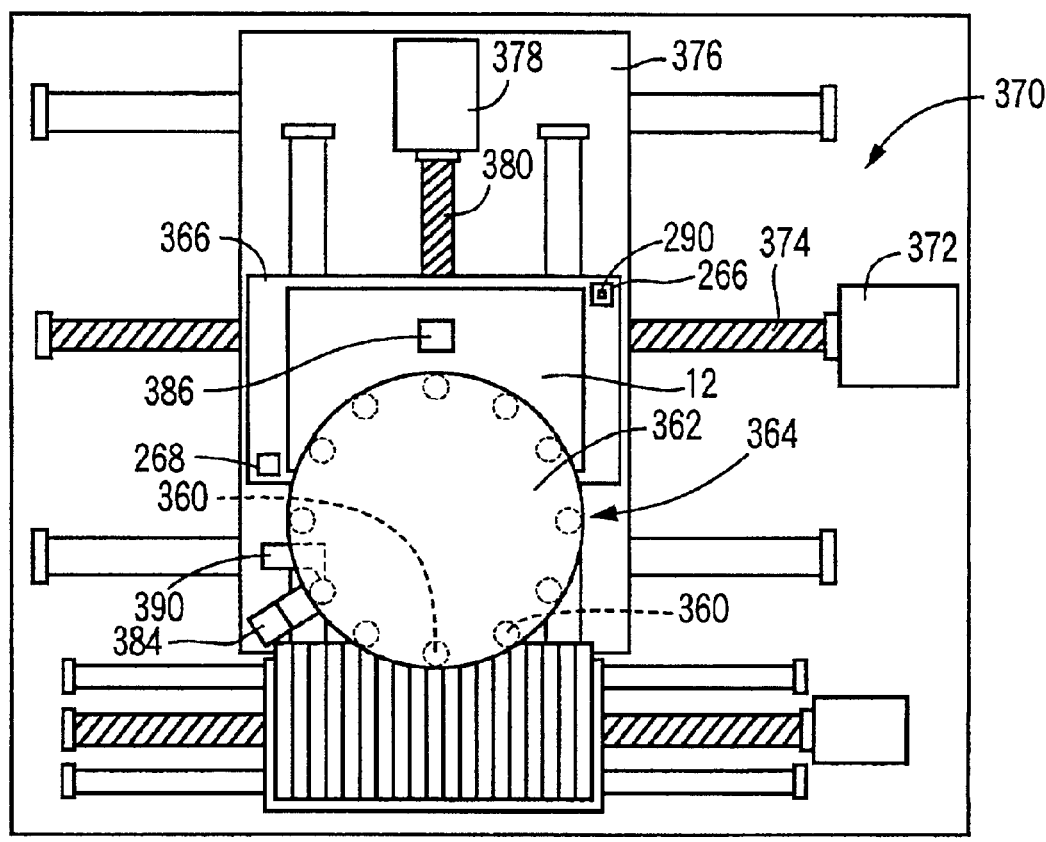
FIG. 19 is a plan view showing an electronic-component mounting system according to yet another embodiment of this invention.

The principle of the present invention is also applicable to an electronic-component mounting system of a type shown in FIG. 19, which includes a multiplicity of component holders 360 which have respective suction nozzles 184 and which are fixedly disposed on one index table 362. The component holders 360 are turned about the axis of rotation of the index table 362 when the index table 362 is intermittently rotated at a predetermined angular interval. The present system further includes an angular positioning device 364 for rotating, and positioning, the index table 362 to, and at, a plurality of predetermined working stations which are arranged on a circular path of movement of the component holders 360, so that the suction nozzle 184 held by each component holder 360 can be turned about a turning axis (i.e., an axis of the index table 362) and stopped at the working stations. The system further includes a PWB support device 366 for supporting the printed-wiring board 12, and an XY positioning device 370 for positioning the PWB support device 366 in the X-axis and Y-axis directions in the XY plane parallel to the upper surface 28 of the printed-wiring board 12. The XY positioning device 370 includes an X-axis slide 376 movable by an X-axis drive motor 372 and a ballscrew 374, and a Y-axis slide which is movable on the X-axis slide 376 by a Y-axis drive motor 378 and a ballscrew 380. The PWB support device 366 is mounted on the Y-axis slide. An image-taking device 384 which includes a component camera and a waveguide device and which is operable to take an image of the electronic component 82 is fixedly disposed at a position at which the component camera is opposed to the end face of the suction nozzle 184 of the component holder 360 located at one of the above-indicated working stations. A first rotating device (not shown) is fixedly disposed above the image-taking device 384 and the corresponding component holder 360, for rotating this component holder 360. A second rotating device (not shown) is fixedly disposed at the working station between the working station at which the image-taking device 384 is disposed, and the working station at which the electronic component 82 is mounted on the printed-wiring board 12. The second rotating device is provided to rotate the component holder 360 to eliminate an angular-positional error of the electronic component 82. A Z-axis drive device (not shown) is provided to lift and lower the suction nozzle 184 for holding the electronic component 82 and for mounting the electronic component 82 on the board 12. A fiducial mark camera 386 is fixedly disposed for taking an image of each of fiducial marks provided on the printed-wiring board 12 supported on the PWB support device 366. In the interest of simplicity, FIG. 19 does not show support structures for supporting the index table 362, image-taking device 384, fiducial mark camera 386, and a dog 390. The index table 362 may be replaced by a plurality of rotary members which are rotated about a common axis of rotation by a cam device, at a controlled rotating velocity, so that the rotary members are stopped at a plurality of working stations at different times. For instance, the rotary members hold respective component holders 360 such that the component holder 360 held by each rotary member is rotatable and axially movable relative to the rotary member. If the present electronic-component mounting system of FIG. 19 employs the above-described calibration platforms 266, 268 and calibration gauge 290, the system can enjoys the same advantages as those of the system shown in FIGS. 1 and 2.

In the electronic-component mounting system of FIG. 1 or FIG. 18, it is possible to omit the calibration platforms 266, 268 or the calibration gauge 290. In this case, at the image taking positions or position for the image taking devices 248 or the component camera 356, the suction nozzle 184 is lowered down to the same height position as that at which the electronic component 82 is mounted on the printed-wiring board 12, so that the position of rotation axis of the suction nozzle 184 may be detected in a conventional manner in which, first, respective images of the lower end surface of the suction nozzle 184 assuming respective pre-determined angular positions, such as 0 degree and 180 degrees, or 0, 90, 180, and 270 degrees, are taken and the thus taken images are processed to determine the position of rotation axis of the nozzle 184. This method is a preferred embodiment in accordance with claim 1 or claim 2.

In the illustrated embodiments, the first image-taking device 248, 356, 384 and the second image-taking devices in the form of the fiducial mark camera 240, 386 are arranged to take a two-dimensional image at one time. However, any of these first and second image-taking devices may be replaced by a line-sensor type imaging device using a straight array of multiple imaging elements which is inter-mittently moved relative to an object by a predetermined pitch to obtain multiple lines of image which collectively form a two-dimensional image. Where the first image-taking device is replaced by a line-sensor type imaging device, the line-sensor type imaging device may be constructed such that a straight array of multiple imaging elements is disposed so as to extend in a first direction parallel to the top surface of the electronic component. In this case, the straight array of imaging elements is intermittently moved in a second direction which is parallel to the top surface of the electronic component and intersects the first direction (i.e., the direction of extension of the straight array).

In each of the illustrated embodiments, the component-mounting surface 28 of the printed-wiring board 12 is level with the reference surfaces 286 of each calibration platform 266, 268. Alternatively, the surface 28 of the board 12 may be level with the support surface 292 of each platform 266, 268, so long as the fiducial mark camera 240 can be focused on both the fiducial marks provided on the surface 28 of the board 12 and the reference marks 288 provided on the reference surfaces 286 of each platform 266, 268. Those two manners are encompassed by the previously-explained third feature (3) wherein the calibration member (266, 268) has, substantially on the position-detecting plane including the component-mounting surface (28) of the circuit substrate (12), the support surface (292) and the first positioning references (288), if the thickness of the calibration gauge 290 is sufficiently small or the depth of the support surface 292 is sufficiently shallow.

In each of the illustrated embodiments, the suction nozzle 184 not holding the electronic component 82 may be lowered, while taking a substantially vertical posture, so as to be positioned at an image-taking position where a lower end surface of the suction nozzle 184 is substantially level with the component-mounting surface 28 of the printed-wring board 12 as a circuit substrate, and each one of the image taking devices 248 may take a first image of the lower end surface of the suction nozzle 184 positioned at the image-taking position. Then, at least one time, the suction nozzle 184 may be rotated about the rotation axis thereof by a predetermined angle (e.g., 90 degrees), so that the image-taking device may take a second image of the lower end surface of the suction nozzle 184 rotated by the predetermined angle. In this modified embodiment according to the present invention, the image processing device 312 processes the first image and the second image, to determine a position of the rotation axis of the suction nozzle 184 relative to the center point of the imaging area of the each image-taking device 248 (or the component camera 250 thereof). At the image-taking position, the lower end surface of the suction nozzle 184 may be literally level with the component-mounting surface 28 of the printed-wring board 12, or may be more or less higher than the surface 28, e.g., by a distance equal to a sufficiently small thickness of the electronic component 82. Those two manners are encompassed by the previously-explained second feature (2).

While the preferred embodiments of the present invention have been described in detail, it is to be understood that the present invention may be embodied with various changes and improvements, such as those described in SUMMARY OF THE INVENTION, that may occur to a person skilled in the art without departing from the spirit and scope of the invention defined in the appended claims.

What is claimed is:

1. A method of detecting a position of a rotation axis of a suction nozzle of an electric-component mounting apparatus, the suction nozzle holding, by suction, an electric component, and being rotated about the rotation axis thereof to rotate the electric component held thereby, so that the electric component rotated is mounted on a component-mounting surface of a circuit substrate, comprising lowering a suction nozzle taking a substantially vertical posture, to position the suction nozzle at a rotation-axis detecting position where a lower end surface of the suction nozzle is substantially level with the component-mounting surface of a circuit substrate, and:

detecting, on a position-detecting plane including the component-mounting surface of the circuit substrate, the position of the rotation axis of the suction nozzle, wherein the position-detecting plane is co-planar with the component-mounting surface of the circuit substrate.

2. A method according to claim 1, wherein the step of lowering the suction nozzle comprises lowering the suction nozzle to an image-taking position as the rotation-axis detecting position, and wherein the step of detecting the position comprises, taking, with an image-taking device, a first image of the lower end surface of the suction nozzle positioned at the image-taking position, rotating, at least one time, the suction nozzle about the rotation axis thereof by a predetermined angle, taking, with the image-taking device, a second image of the lower end surface of the suction nozzle rotated by the predetermined angle, and processing the first image and the second image, to determine the position of the rotation axis of the suction nozzle.

3. A method according to claim 1, wherein the step of detecting the position comprises:

preparing a calibration member having, substantially on the position-detecting plane, a support surface and at least one first positioning reference, placing, on the support surface, a calibration gauge having at least one second positioning reference, taking, with an image-taking device, a first image of the first positioning reference and the second positioning reference, holding, with the suction nozzle, the calibration gauge to move the gauge off the support surface, rotating the suction nozzle holding the calibration gauge, about the rotation axis of the nozzle, to rotate the gauge by a predetermined angle, placing, with the suction nozzle, the calibration gauge rotated by the predetermined angle, on the support surface, taking, with the image-taking device, a second image of the first positioning reference and the second positioning reference, and processing the first image and the second image, to determine a relative position between a reference point of the calibration member and the position of the rotation axis of the suction nozzle.

4. A method according to claim 3, wherein the step of detecting the position comprises repeating, at least one more time, the step of holding the calibration gauge, the step of rotating the suction nozzle, the step of placing the calibration gauge, and the step of taking the second image, and wherein the step of processing the first and second images comprises processing the first image and at least two second images to determine the relative position between the reference point of the rotation axis of the suction nozzle.

5. A method of detecting a position of a rotation axis of a suction nozzle of an electric-component mounting apparatus, the suction nozzle holding, by suction, an electric component, the mounting apparatus including a fiducial-mark-image taking device that takes an image of at least one fiducial mark provided on a circuit substrate, determining, based on the taken image, a position of the circuit substrate, moving, according to the determined position, the suction nozzle holding the electric component, and rotating the suction nozzle about the rotation axis thereof to rotate the electric component to a predetermined angular position, so that the electric component taking the predetermined angular position is mounted at a predetermined position on a component-mounting surface of the circuit substrate, the method comprising the steps of:

preparing a calibration member having a support surface parallel to the component-mounting surface, and having at least one first positioning reference, placing, on the support surface, a calibration gauge having at least one second positioning reference, taking, with the fiducial-mark-image taking device, a first image of the first positioning reference and the second positioning reference, holding, with the suction nozzle, the calibration gauge to move the gauge off the support surface, rotating the suction nozzle holding the calibration gauge, about the rotation axis of the nozzle, to rotate the gauge by a predetermined angle, placing, with the suction nozzle, the calibration gauge rotated by the predetermined angle, on the support surface, taking, with the fiducial-mark-image taking device, a second image of the first positioning reference and the second positioning reference, and processing the first image and the second image, to determine a relative position between a reference point of the calibration member and the position of the rotation axis of the suction nozzle.

6. A method according to claim 5, further comprising repeating, at least one more time, the step of holding the calibration gauge, the step of rotating the suction nozzle, the step of placing the calibration gauge, and the step of taking the second image, and wherein the step of processing the first and second images comprises processing the first image and at least two second images to determine the relative position between the reference point of the calibration member and the position of the rotation axis of the suction nozzle.

7. A method according to claim 6, wherein at least one of the calibration member and the calibration gauge has a plurality of reference marks which are provided in a surface thereof and which provide a corresponding one of said at least one first positioning reference and said at least one second positioning reference.

8. A method according to claim 7, wherein the calibration gauge has a plurality of reference holes which are formed through a thickness thereof and which provide the plurality of reference marks.

9. A method according to claim 7, wherein the calibration gauge has at least two groups of reference marks including a first group of reference marks that are distant from each other by a first distance, and a second group of reference marks which are distant from each other by a second distance different from the first distance.

10. A method according to claim 7, wherein the calibration member has an upper surface level with an upper surface of the calibration gauge, and has the plurality of reference marks on the upper surface thereof.

11. A method according to claim 5, further comprising a step of applying a negative pressure to the calibration gauge placed on the calibration member.

12. A method according to claim 5, further comprising steps of:
- taking, with the fiducial-mark-image taking device, an image of the first positioning reference of the calibration member, and
- determining, based on the taken image of the first positioning reference, an error of a relative position between the fiducial-mark-image taking device and the calibration member.

13. A method of detecting a position of a rotation axis of a suction nozzle of an electric-component mounting apparatus, a free end of the suction nozzle holding, by suction, an electric component, the suction nozzle being rotated about the rotation axis thereof to rotate the electric component held thereby, so that the electric component rotated is mounted on a component-mounting surface of a circuit substrate, comprising:
- rotating the suction nozzle about the rotation axis thereof by a predetermined angle,
- positioning, before and after the suction nozzle is rotated about the rotation axis thereof, the suction nozzle such that the free end thereof is positioned on a position-detecting plane which is co-planar with the component-mounting surface of the circuit substrate, and
- detecting, on the position-detecting plane, the position of the rotation axis of the suction nozzle, by utilizing the rotating and positioning of the suction nozzle.

* * * * *